United States Patent
Ikeda et al.

(10) Patent No.: US 12,255,192 B2
(45) Date of Patent: Mar. 18, 2025

(54) DISPLAY DEVICE

(71) Applicant: Japan Display Inc., Tokyo (JP)

(72) Inventors: Masanobu Ikeda, Tokyo (JP); Yoshinori Aoki, Tokyo (JP); Akihiro Ogawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 741 days.

(21) Appl. No.: 17/396,826

(22) Filed: Aug. 9, 2021

(65) Prior Publication Data

US 2022/0059517 A1 Feb. 24, 2022

(30) Foreign Application Priority Data

Aug. 24, 2020 (JP) ................... 2020-141061

(51) Int. Cl.
   *H01L 25/16* (2023.01)
(52) U.S. Cl.
   CPC ................. *H01L 25/167* (2013.01)
(58) Field of Classification Search
   CPC ... H01L 25/167; H01L 25/0753; H01L 33/58; G02F 1/136209; G02F 1/133512; H10K 59/126
   See application file for complete search history.

(56) References Cited

U.S. PATENT DOCUMENTS

| | | | |
|---|---|---|---|
| 10,593,743 B2 | 3/2020 | Son et al. | |
| 2012/0229438 A1* | 9/2012 | Fujita | G09G 3/3266 345/211 |
| 2018/0308832 A1 | 10/2018 | Shin et al. | |
| 2018/0331124 A1* | 11/2018 | Cho | H10K 59/126 |
| 2019/0157248 A1 | 5/2019 | Lee et al. | |
| 2019/0324577 A1 | 10/2019 | Pan | |
| 2019/0385509 A1 | 12/2019 | Lu et al. | |
| 2021/0210513 A1 | 7/2021 | Ikeda et al. | |

OTHER PUBLICATIONS

English machine translation of Office Action dated Feb. 27, 2024 issued in JP Appl. No. 2020-141061. [JP-OA1], 5 pages.

* cited by examiner

*Primary Examiner* — Cuong B Nguyen
(74) *Attorney, Agent, or Firm* — XSENSUS LLP

(57) ABSTRACT

A display device includes a display portion mounted with a first LED and a second LED are mounted, a pixel circuit portion provided with a first pixel-circuit thin film transistor electrically connected to the first LED and a second pixel-circuit thin film transistor electrically connected to the second LED, a drive circuit portion provided with a drive-circuit thin film transistor, and a shielding layer provided between the display portion and the drive circuit portion. A fixed potential is applied to the shielding layer. The second LED overlaps the drive circuit portion with the shielding layer therebetween.

8 Claims, 16 Drawing Sheets

(1)

DISPLAY DEVICE

CROSS-REFERENCE TO RELATED APPLICATION

This application is based on and claims the benefit of priority from the prior Japanese Patent Application No. 2020-141061, filed on Aug. 24, 2020, the entire contents of which are incorporated herein by reference.

FIELD

One embodiment in the present invention relates to a display device, in particular, a display device using an LED.

BACKGROUND

A display device using a liquid crystal or an OLED (Organic Light Emitting Diode) is known as a small or medium-sized display device such as a smart phone. In particular, an OLED display device using the OLED, which is a self-light emitting element, has the advantages of high-contrast and no need for a backlight, as compared with a liquid crystal display device.

In recent years, a so-called micro LED display device and a mini LED display device in which minute LED chips are mounted in pixels of a circuit substrate have been developed as next-generation display devices. The LED is a self-light emitting element similar to the OLED, but unlike OLED, the LED is composed of stable inorganic compounds containing gallium (Ga) or indium (In), and therefore, the micro LED display device has high reliability as compared with the OLED display device. In addition, the LED has high light emission efficiency and high brightness can be realized. Therefore, the micro LED display device is expected to be a next-generation display with high reliability, high brightness, and high contrast.

Further, in order to realize a display portion having a large display surface in a display device, a technological development of a so-called narrow frame, in which the frame located outside the display portion is made smaller, has been promoted. In general, a drive circuit is provided outside the display portion. For example, U.S. Patent Application Publication No. 2018/0308832 discloses a plurality of display panels in which drive circuits are arranged together, and a method of connecting regions in which drive circuits of each display panel are not provided to narrow the frame. Further, US Patent Application Publication No. 2019/0385509 discloses a display device in which chips for driving a plurality of LEDs are arranged in a display portion.

SUMMARY

A display device according to an embodiment of the present invention includes a display portion mounted with a first LED and a second LED, a pixel circuit portion provided with a first pixel-circuit thin film transistor electrically connected to the first LED and a second pixel-circuit thin film transistor electrically connected to the second LED, a drive circuit portion provided with a drive-circuit thin film transistor, and a shielding layer provided between the display portion and the drive circuit portion. A fixed potential is applied to the shielding layer. The second LED overlaps the drive circuit portion with the shielding layer therebetween.

A display device according to an embodiment of the present invention includes a display portion in which an LED is mounted, a pixel circuit portion provided with a latch circuit for controlling the LED, and a shielding layer provided between the display portion and the drive circuit portion. A fixed potential is applied to the shielding layer. The LED overlaps the latch circuit with the shielding layer therebetween.

DESCRIPTION OF EMBODIMENTS

Figure 1A:
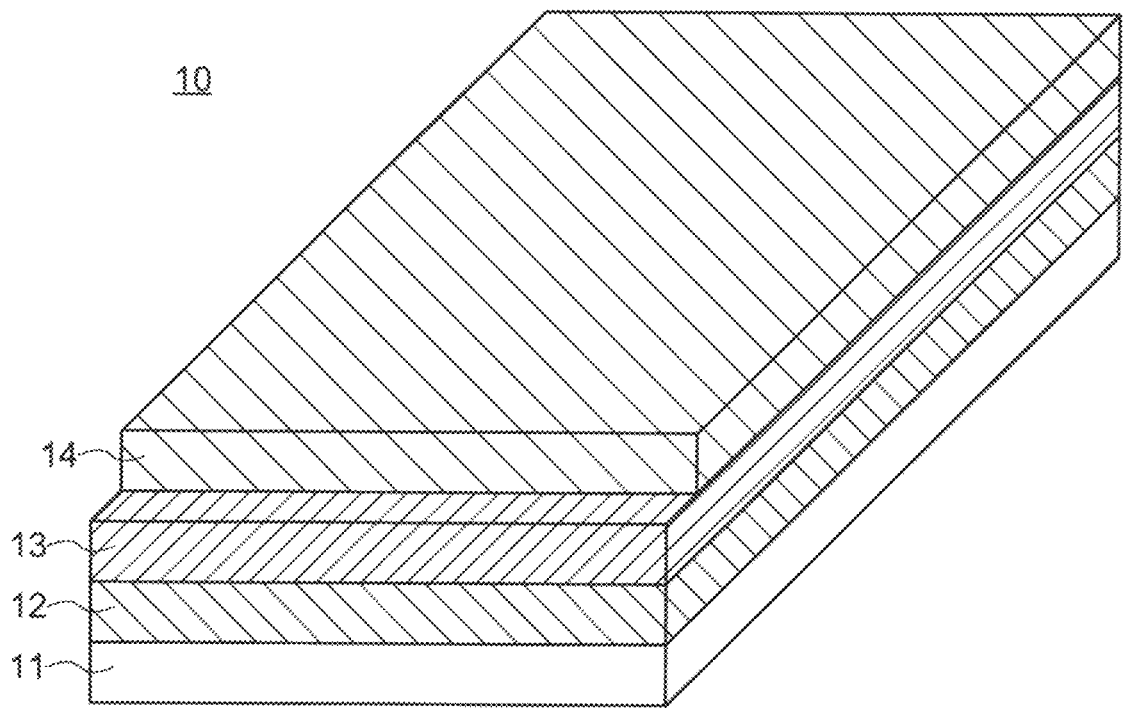
FIG. 1A is a schematic perspective view of a display device according to an embodiment of the present invention.

U.S. Patent Application Publication No. 2018/0308832 does not narrow the entire display device. Further, US Patent Application Publication No. 2019/0385509 has problems of a decrease in yield and an increase in cost due to an increase in the number of steps for mounting an IC. Therefore, in narrowing the frame of the display device, it is desirable that the display portion can be enlarged while securing a region where a drive circuit is formed on the substrate.

In view of the above problems, one of the objects of an embodiment of the present invention is to narrow a frame of a display device in which the drive circuit is formed on the substrate.

Hereinafter, embodiments of the present invention are described with reference to the drawings. Each of the embodiments is merely an example, and a person skilled in the art can easily conceive of the invention by appropriately changing the embodiment while maintaining the gist of the invention, and such changes are naturally included in the scope of the invention. For the sake of clarity of the description, the drawings may be schematically represented with respect to the widths, thicknesses, shapes, and the like of the respective portions in comparison with actual embodiments. However, the illustrated shapes are merely examples and are not intended to limit the interpretation of the present invention.

The expressions "a includes A, B or C", "a includes any of A, B and C", "a includes one selected from the group consisting of A, B and C", and "a includes one selected from the group consisting of A, B and C" do not exclude the case where a includes a plurality of combinations of A to C unless otherwise specified. Furthermore, these expressions do not exclude the case where a includes other elements.

In this specification, although the phrase "above" or "above direction" or "below" or "below direction" is used for convenience of explanation, in principle, the direction from a substrate toward a structure is referred to as "above" or "above direction" with reference to a substrate in which the structure is formed. Conversely, the directions from the structure to the substrate are "below" or "below direction". Therefore, in the expression of the structure over the substrate, one surface of the structure facing the substrate is the bottom surface of the structure and the other surface is the top surface of the structure. In addition, the expression "the structure over the substrate" only explains the vertical relationship between the substrate and the structure, and another member may be placed between the substrate and the structure. Furthermore, the terms "above" or "above direction" or "below" or "below direction" mean the order of stacked layers in the structure in which a plurality of layers are stacked, and may not be related to the position in which layers are superimposed in a plan view.

In this specification, "display device" is intended to include a wide range of devices that display a still image or moving image, and may include not only a display panel and a display module but also a device to which other optical members (for example, a polarizing member or touch panel, etc.) are attached.

First Embodiment

A display device 10 according to an embodiment of the present invention is described while referring to FIGS. 1A to 6.

[1. Outline of Configuration of Display Device 10]

An outline of a configuration of the display device 10 according to the embodiment of the present invention is described while referring to FIGS. 1A to 1D.

FIG. 1A is a schematic perspective view of a display device 10 according to an embodiment of the present invention. Specifically, FIG. 1A is a block diagram showing a configuration of the display device 10 as layers. As shown in FIG. 1, the display device 10 includes a substrate 11, a thin film transistor forming layer 12, a wiring forming layer 13, and an LED mounting layer 14. The thin film transistor forming layer 12 is provided on the substrate 11, and a plurality of thin film transistors included in a pixel circuit or a drive circuit are formed in the thin film transistor layer 12. The LED mounting layer 14 is provided on the thin film transistor forming layer 12, and a plurality of LEDs included in the display portion are mounted in the LED mounting layer 14. The wiring forming layer 13 is provided between the thin film transistor forming layer 12 and the LED mounting layer 14, and a wiring layer that electrically connects the thin film transistor of the thin film transistor forming layer 12 and the LED of the LED mounting layer 14 is formed in the wiring forming layer 13. In the display device 10, the thin film transistor formed on the thin film transistor forming layer 12 can be used to control the LED mounted on the LED mounting layer 14, and an image can be displayed on a display surface of the display device 10. The display surface of the display device 10 may be provided on the LED mounting layer 14 side or may be provided on the substrate 11 side. When the display surface of the display device 10 is provided on the substrate 11 side, light emitted from the LED mounted in the LED mounting layer 14 is extracted to the outside through the substrate 11.

Figure 1B:
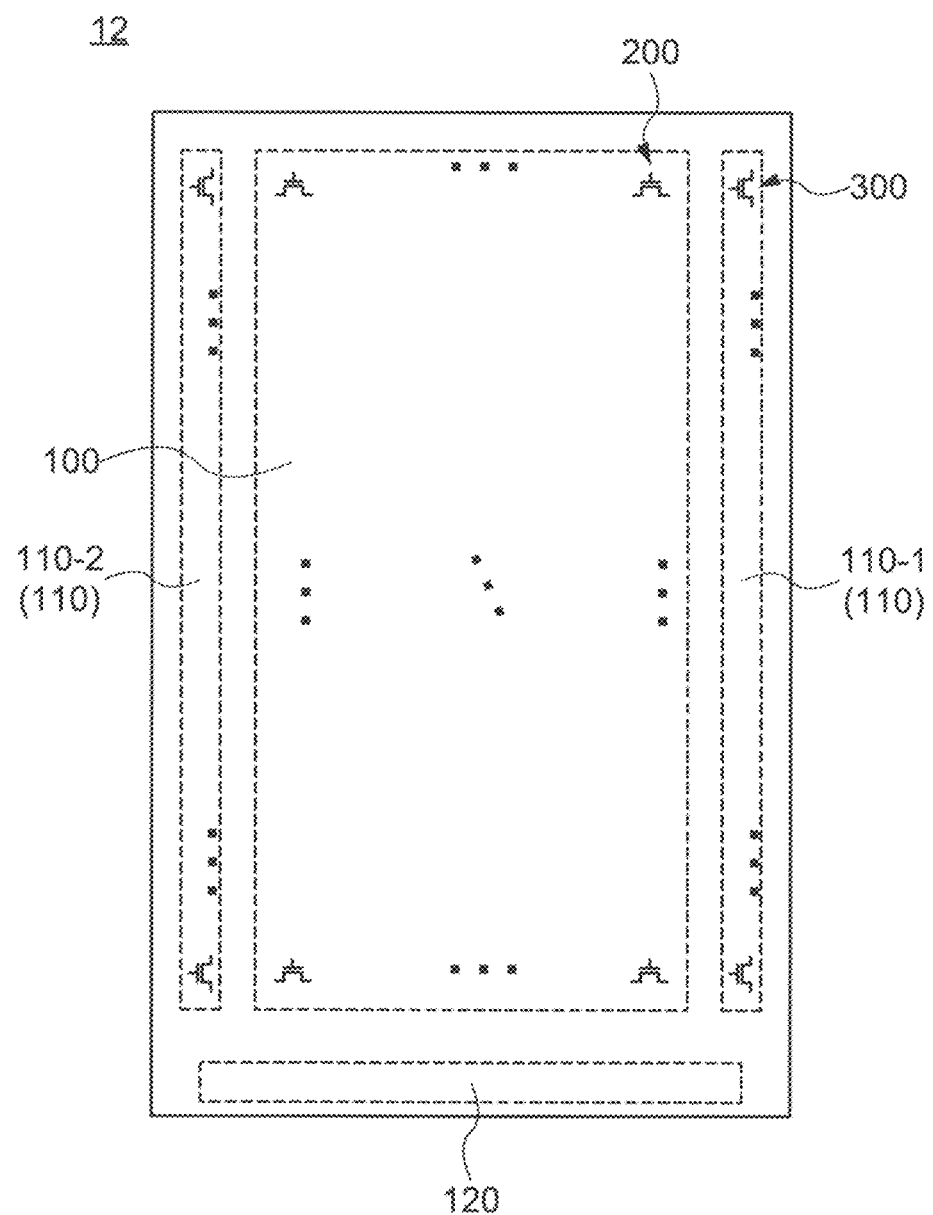
FIG. 1B is a schematic plan view of a thin film transistor forming layer of a display device according to an embodiment of the present invention.
Figure 1C:
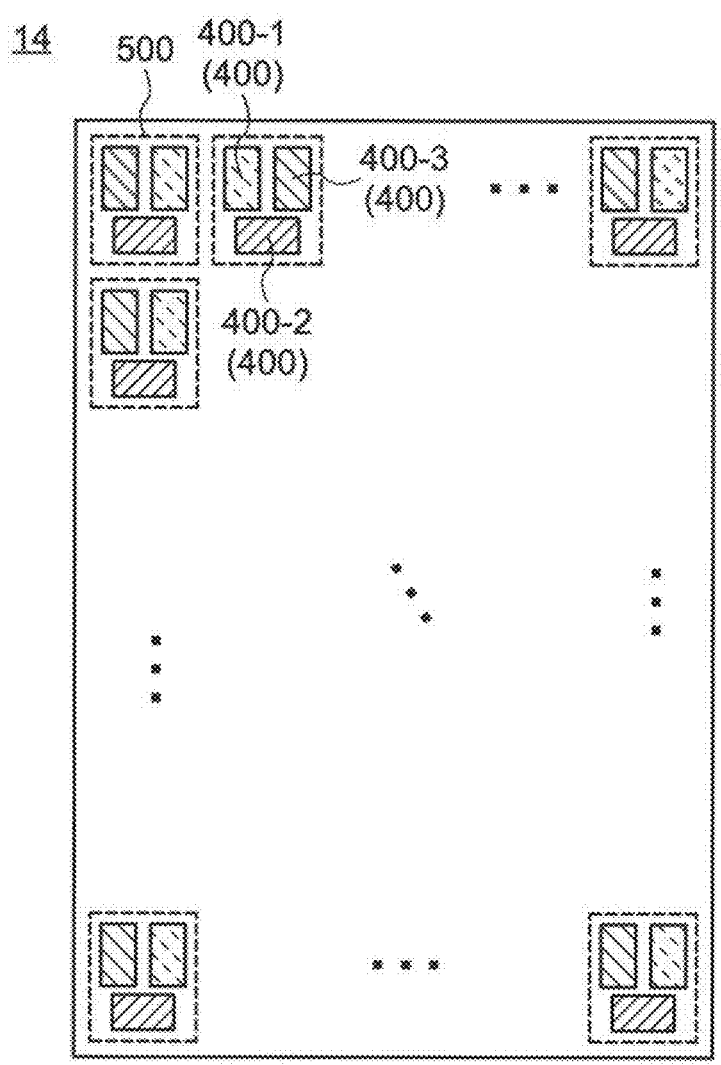
FIG. 1C is a schematic plan view of an LED mounting layer of the display device according to an embodiment of the present invention.

FIG. 1B is a schematic plan view of the thin film transistor forming layer 12 of the display device 10 according to the embodiment of the present invention. As shown in FIG. 1B, the thin film transistor forming layer 12 includes a pixel circuit portion 100, a first drive circuit portion 110-1, a second drive circuit portion 110-2, and a terminal portion 120. The pixel circuit portion 100 is provided in a central portion of the thin film transistor forming layer 12. The first drive circuit portion 110-1 is adjacent to the pixel circuit portion 100 and is provided in a peripheral portion of the thin film transistor forming layer 12. The second drive circuit portion 110-2 is provided on a peripheral portion on the opposite side of the peripheral portion where the first drive circuit portion 110-1 is provided, with the pixel circuit portion 100 therebetween. That is, each of the first drive circuit portion 110-1 and the second drive circuit portion 110-2 is provided outside the pixel circuit portion 100. The terminal portion 120 is provided in a peripheral portion different from the peripheral portions in which each of the first drive circuit portion 110-1 and the second drive circuit portion 110-2 is provided. In other words, the pixel circuit portion 100 is surrounded by the first drive circuit portion 110-1, the second drive circuit portion 110-2, and the terminal portion 120. In the following description, when the first drive circuit portion 110-1 and the second drive circuit portion 110-2 are not particularly distinguished, each of the first drive circuit portion 110-1 and the second drive circuit portion 110 is described as a drive circuit portion 110.

Although two drive circuit portions 110 are shown in FIG. 1B, the number of drive circuit portions 110 is not particularly limited. The number of drive circuit portions 110 may be one or three or more.

The arrangement of the pixel circuit portion 100, the drive circuit portion 110, and the terminal portion 120 is not limited to the configuration shown in FIG. 1B. For example, the drive circuit portion 110 may be provided in the pixel circuit portion 100.

In FIG. 1B, the shapes of the pixel circuit portion 100, the drive circuit portion 110, and the terminal portion 120 are rectangular. However, the shapes of the pixel circuit portion 100, the drive circuit portion 110, and the terminal portion 120 are not limited to a rectangle. The shapes of the pixel circuit portion 100, the drive circuit portion 110, and the terminal portion 120 may include not only a straight line portion but also a bent portion. For example, the shapes of the pixel circuit portion 100, the drive circuit portion 110, and the terminal portion 120 may be substantially circular or substantially elliptical.

A pixel-circuit thin film transistor 200 included in a sub-pixel circuit is formed in the pixel circuit portion 100. On the other hand, a drive-circuit thin film transistor 300 included in a drive circuit for driving the sub-pixel circuit, for example, a scanning drive circuit is formed in the drive circuit portion 110. The details of configurations of the pixel-circuit thin film transistor 200 and the drive-circuit thin film transistor 300 are described later. A connection terminal which is electrically connected to the drive circuit is formed in the terminal portion 120. The connection terminal can be connected to an external device via a flexible printed circuit board (FPC) or the like. Therefore, a control signal from the external device is input to the drive circuit via the connection terminal.

Figure 10:
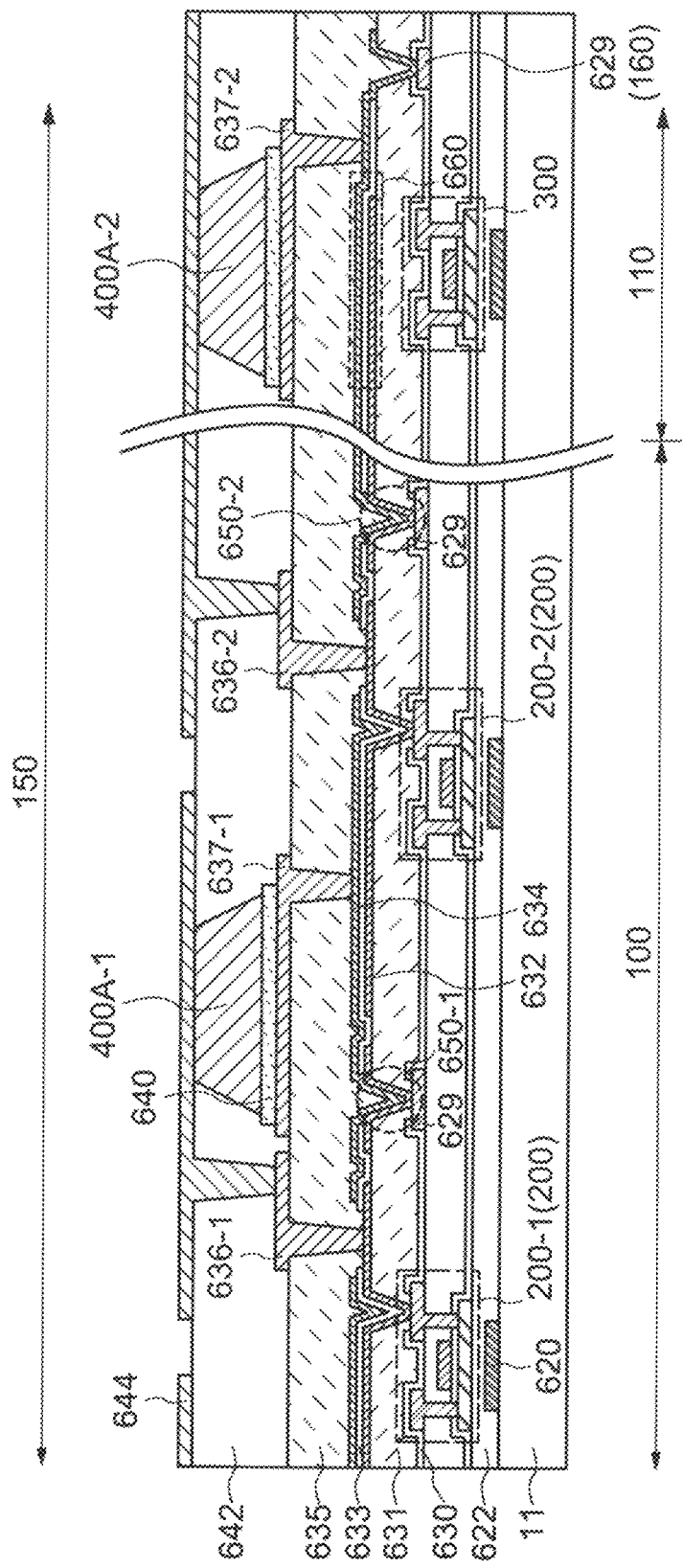
FIG. 10 is a schematic partial cross-sectional view of a display device according to an embodiment of the present invention.

FIG. 10 is a schematic plan view of the LED mounting layer 14 of the display device 10 according to the embodiment of the present invention. As shown in FIG. 10, a first LED 400-1, a second LED 400-2, and a third LED 400-3 are mounted. For example, the first LED 400-1, the second LED 400-2, and the third LED 400-3 can be a red LED, a green LED, and a blue LED, respectively. In this case, by controlling each of the first LED 400-1, the second LED 400-2, and the third LED 400-3, it is possible to emit various colors including white light. In other words, one first LED400-1, one second LED400-2, and one third LED400-3 are regarded as one unit, and each unit can emit various colors. In the following description, a configuration including the first LED 400-1, the second LED 400-2, and the third LED 400-3 are described as a pixel 500. Further, when the first LED 400-1, the second LED 400-2, and the third LED 400-3 are not particularly distinguished, each of the first LED 400-1, the second LED 400-2, and the third LED 400 is described as LED 400. Further, the LED 400 in the pixel 500 may be described as a sub pixel.

In FIG. 10, although a plurality of pixels 500 are arranged in a matrix, the arrangement of the pixels 500 is not limited to this. The pixels 500 may be arranged in consideration of the shape of the substrate 11 or the specifications of the product to which the display device 10 is applied.

In the pixel 500 shown in FIG. 10, the first LED 400-1 and the third LED 400-3 are arranged adjacent to each other in the same direction. On the other hand, the second LED 400-2 is arranged adjacent to the first LED 400-1 and the third LED 400-3 in the direction perpendicular to the third LED 400-3. However, the arrangement of the LEDs 400 in the pixel 500 is not limited to this. For example, three LEDs 400 may be arranged in the same direction in the pixel 500.

The number of LEDs 400 in the pixel 500 is not limited to three. The number of LEDs 400 may be four or more. For example, the pixel 500 may include a yellow LED, an orange LED, a white LED, an ultraviolet LED, an infrared LED and the like, in addition to the red LED, the green LED, and the blue LED.

Figure 1D:
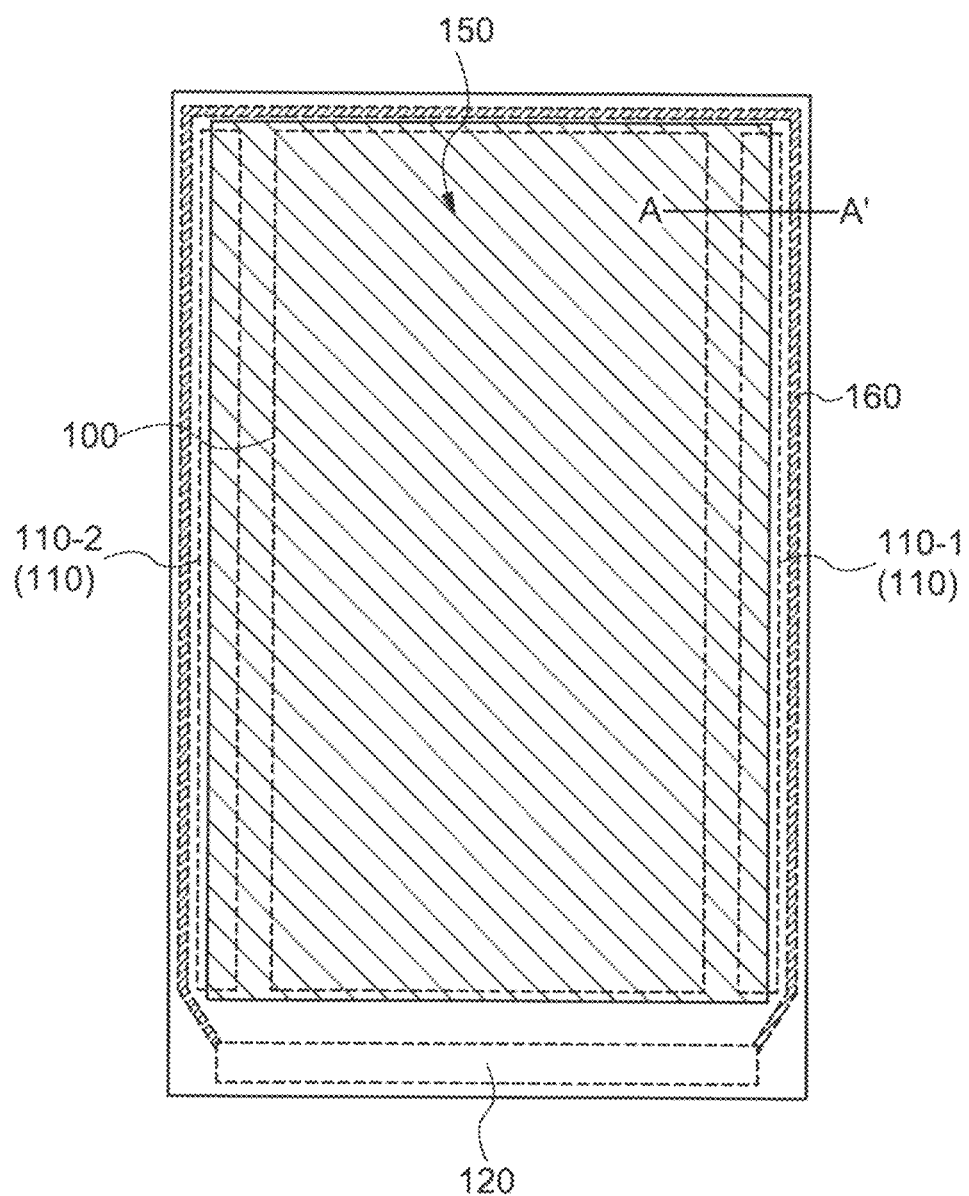
FIG. 1D is a schematic plan view of a display device according to an embodiment of the present invention.

FIG. 1D is a schematic plan view of the display device 10 according to the embodiment of the present invention. Specifically, in FIG. 1D, the positional relationship of the configurations included in the thin film transistor forming layer 12, the wiring forming layer 13, and the LED mounting layer 14 is shown as the plan view of the display device 10. As shown in FIG. 1D, the display device 10 includes a display portion 150 corresponding to a display surface. The display portion 150 can display a full-color image by using the plurality of pixels 500 arranged in the LED mounting layer 14. In other words, the display portion 150 is a portion of the LED mounting layer 14 in which the LED 400 is mounted. The display portion 150 overlaps not only the pixel circuit portion 100 but also at least a part of the drive circuit portion 110. In a plan view, an area of the display portion 150 may be larger than an area of the pixel circuit portion 100. Although the details are described later, in the display device 10, the LED 400 is provided so as to overlap the drive-circuit thin film transistor 300 in the drive circuit portion 110. Therefore, in the display device 10, the display portion 150 can be provided without being limited by the area or arrangement of the drive circuit portion 110. Therefore, the display device 10 has a small frame surrounding the display portion 150 (display surface), and is a so-called narrow frame display device.

Further, in the display device 10, a common potential wiring 160 is provided so as to surround the display portion 150. The common potential wiring 160 is electrically connected to the terminal portion 120, and a constant potential can be supplied to the common potential wiring 160. Further, the common potential wiring 160 can be electrically connected to the LED 400 in the pixel 500 to supply a constant potential to the LED 400. In other words, the common potential wiring 160 is a power supply wiring (a cathode wiring or an anode wiring) for driving the LED 400. The common potential wiring 160 may be provided in the wiring forming layer 13.

[2. Sub-Pixel Circuit of Sub-Pixel]

Figure 2:
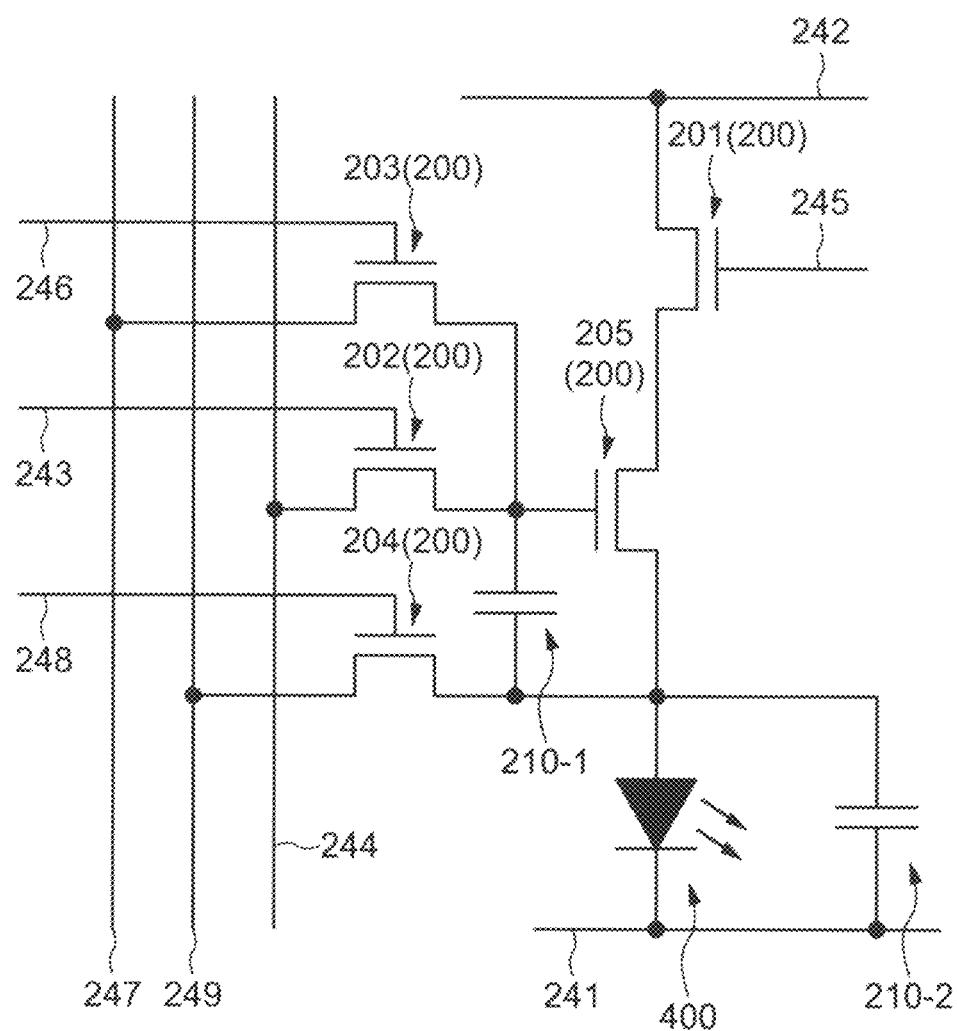
FIG. 2 is a circuit diagram showing a sub-pixel circuit of a sub-pixel of a display device according to an embodiment of the present invention.

A configuration of a sub-pixel circuit of the sub-pixel of the display device 10 according to the embodiment of the present invention is described while referring to FIG. 2.

FIG. 2 is a circuit diagram showing a sub-pixel circuit of the sub-pixels of the display device 10 according to the embodiment of the present invention. As shown in FIG. 2, the sub-pixel circuit includes five pixel-circuit thin film transistors 200, a first capacitor 210-1, a second capacitor 210-2, a low potential power supply wiring 241, a high potential power supply wiring 242, a scanning wiring 243, a data signal wiring 244, a light emission control scanning wiring 245, an initialization scanning wiring 246, an initialization wiring 247, a reset scanning wiring 248, a reset wiring 249, and the LED 400. In the following description, for convenience, the five pixel-circuit thin film transistors 200 are described as a light emission control thin film transistor 201, a selective thin film transistor 202, an initialized thin film transistor 203, a reset thin film transistor 204, and a drive thin film transistor 205, which are classified according to the function of the thin film transistor.

A cathode of the LED 400 is electrically connected to the low potential power supply wiring 241 and an anode of the LED 400 is electrically connected to one of a source and a drain of the drive thin film transistor 205. The display device 10 can also be configured such that the anode of the LED 400 is electrically connected to the high-potential power supply wiring 242 and the cathode of the LED 400 is electrically connected to one of the source and the drain of the drive thin film transistor 205. However, in the following description, for convenience, the configuration in which the cathode of the LED 400 and the low potential power supply wiring 241 are electrically connected is described.

The light emission control thin film transistor 201 is controlled by the light emission control scanning wiring 245, and determines whether or not to pass a current to the LED 400 via the drive thin film transistor 205.

The selective thin film transistor 202 is controlled by the scanning wiring 243, and applies the voltage supplied by the data signal wiring 244 to a gate of the drive thin film transistor 205. As a result, the gate of the drive thin film transistor 205 is fixed at a predetermined potential.

The initialization thin film transistor 203 is controlled by the initialization scanning wiring 246, and applies the voltage supplied by the initialization wiring 247 to the gate of the drive thin film transistor 205. As a result, the gate of the driving thin film transistor 205 is fixed at a predetermined potential.

The reset thin film transistor 204 is controlled by the reset scanning wiring 248, and applies the reverse bias voltage supplied by the reset wiring 249 to the LED 400.

As described above, the drive thin film transistor 205 has a fixed gate potential based on the operation of the selection thin film transistor 202 or the initialized thin film transistor 203, and a current corresponding to the gate potential of the drive thin film transistor 205 is supplied from the high potential power supply wiring 242 to the LED 400.

The sub-pixel drive circuit is not limited to the configuration shown in FIG. 2. For example, the sub-pixel drive circuit may be a circuit consisting of two thin film transistors and one capacitor.

[3. Pixel-Circuit Thin Film Transistor 200]

Figure 3:
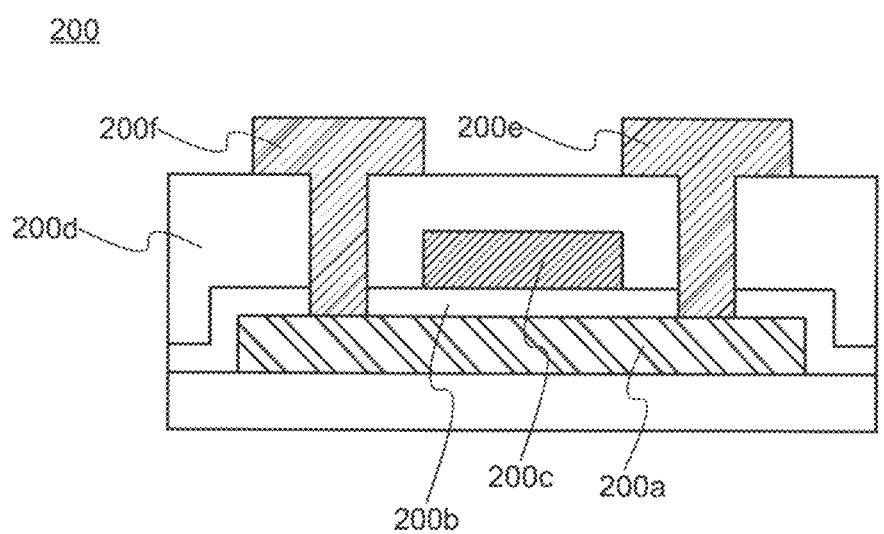
FIG. 3 is a schematic cross-sectional view of a pixel-circuit thin film transistor included in a sub-pixel circuit of a display device according to an embodiment of the present invention.

A configuration of the pixel-circuit thin film transistor 200 included in the sub-pixel circuit of the display device 10 according to the embodiment of the present invention is described while referring to FIG. 3.

FIG. 3 is a schematic cross-sectional view of the pixel-circuit thin film transistor 200 included in the sub-pixel circuit of the display device 10 according to the embodiment of the present invention. As shown in FIG. 3, the pixel-circuit thin film transistor 200 includes a semiconductor layer 200*a*, a gate insulating layer 200*b*, a gate electrode layer 200*c*, an interlayer insulating layer 200*d*, a source electrode layer 200*e*, and a drain electrode layer 200*f*. The gate insulating layer 200*b* is provided so as to cover the semiconductor layer 200*a*. The interlayer insulating layer 200*d* is provided so as to cover the gate electrode layer 200*c*. The gate insulating layer 200*b* and the interlayer insulating layer 200*d* are provided with openings that overlap each of the source electrode layer 200*e* and the drain electrode layer 200*f*. Each of the source electrode layer 200*e* and the drain electrode layer 200*f* is electrically connected to the semiconductor layer 200*a* via the opening.

Although the pixel-circuit thin film transistor 200 shown in FIG. 3 is a so-called top gate type thin film transistor, the configuration of the pixel-circuit thin film transistor 200 is not limited to this. The pixel-circuit thin film transistor 200 may be a bottom gate type thin film transistor in which the gate electrode layer is provided below the semiconductor layer, or may be a dual gate type thin film transistor in which the semiconductor layer is sandwiched between two gate electrode layers.

A semiconductor material capable of forming a channel region can be used as a material of the semiconductor layer 200*a*. For example, silicon, an oxide semiconductor such as indium gallium zinc oxide (IGZO) or zinc oxide (ZnO), or a compound semiconductor such as gallium arsenide (GaAs) or gallium nitride (GaN) can be used as the semiconductor material. When the semiconductor material is silicon, it may be amorphous silicon, polysilicon, or single crystal silicon. The semiconductor layer 200*a* may include not only a channel region but also a source region or a drain region (high-concentration impurity region). Further, a low-concentration impurity region may be included between the channel region and the source region, or between the channel region and the drain region.

For example, silicon oxide, silicon nitride, aluminum oxide, aluminum nitride, or the like can be used as the material of the gate insulating layer 200*b*. Further, the gate insulating layer 200*b* may be a single layer or may be a laminated layer.

For example, metal such as aluminum (Al), titanium (Ti), molybdenum (Mo), copper (Cu), or tungsten (W), or an alloy thereof can be used as the material of the gate electrode layer 200*c*. Further, the gate electrode layer 200*c* may be a single layer or may be a laminated layer.

For example, silicon oxide, silicon nitride, aluminum oxide, aluminum nitride, or the like can be used as the material of the interlayer insulating layer 200*d*. Further, the interlayer insulating layer 200*d* may be a single layer or a laminated layer.

For example, metal such as aluminum (Al), titanium (Ti), molybdenum (Mo), copper (Cu), or tungsten (W), or an alloy thereof can be used as the material of each of the source electrode layer 200*e* and the drain electrode layer 200*f*. Further, each of the source electrode layer 200*e* and the drain electrode layer 200*f* may be a single layer or a laminated layer. Even when the source electrode layer 200*e* and the drain electrode layer 200*f* are described in the present specification, the function of the source electrode layer 200*e* and the function of the drain electrode layer 200*f* may be interchanged.

The pixel-circuit thin film transistor 200 may be an n-channel thin film transistor or a p-channel thin film transistor. The plurality of pixel-circuit thin film transistors 200 included in the sub-pixel circuit may have different channel polarities, and may have different channel lengths or channel widths.

Since a configuration of the drive-circuit thin film transistor 300 is the same as the configuration of the pixel-circuit thin film transistor 200, the description thereof is omitted. The pixel-circuit thin film transistor 200 and the drive-circuit thin film transistor 300 may have different channel polarities, channel lengths, or channel widths.

[4. Configuration of LED 400]

Figure 4:
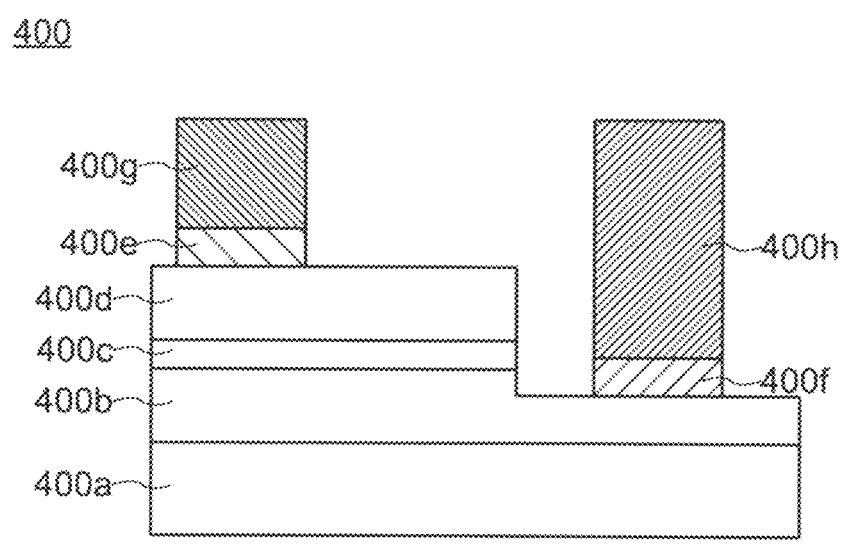
FIG. 4 is a schematic cross-sectional view of an LED mounted on an LED mounting layer of a display device according to an embodiment of the present invention.

A configuration of the LED 400 mounted on the LED mounting layer 14 of the display device 10 according to the embodiment of the present invention is described while referring to FIG. 4. The display device 10 includes the LED 400 having a so-called horizontal LED structure (a horizontal electrode structure).

FIG. 4 is a schematic cross-sectional view of the LED 400 mounted on the LED mounting layer 14 of the display device 10 according to the embodiment of the present invention. As shown in FIG. 4, the LED 400 includes a substrate 400*a*, an n-type semiconductor layer 400*b*, a light emitting layer 400*c*, a p-type semiconductor layer 400*d*, a p-type electrode layer 400*e*, an n-type electrode layer 400*f*, an anode bump 400*g*, and a cathode bump 400*h*.

As described above, the horizontal LED structure is an LED structure in which two electrode layers (p-type electrode layer 400*e* and an n-type electrode layer 400*f*) are provided on one side of the light emitting layer 400*c*.

The substrate 400*a* can support each layer provided over the substrate 400*a*. Further, the substrate 400*a* is preferably a substrate on which the n-type semiconductor layer 400*b*, the light emitting layer 400*c*, and the p-type semiconductor layer 400*d* can grow crystals. For example, a sapphire substrate, a silicon carbide substrate, a gallium nitride substrate, or the like can be used as the substrate 400*a*.

When the LED 400 is a red LED, a material of the light emitting layer 400*c* includes, for example, aluminum, gallium, indium, and phosphorus. The composition ratio of aluminum, gallium, and indium is typically aluminum: gallium: indium=0.225: 0.275: 0.5, but not limited to this. Further, each material of the n-type semiconductor layer 400b and the p-type semiconductor layer 400d in this case is aluminum phosphide indium. Alternatively, the material of the light emitting layer 400c includes, for example, indium, gallium, and nitrogen. The composition ratio of indium and gallium is typically indium: gallium=0.45: 0.55, but not limited to this.

When the LED 400 is a green LED, a material of the light emitting layer 400c includes, for example, indium, gallium, and nitrogen. The composition ratio of indium to gallium is typically indium: gallium=0.30: 0.70, but not limited to this. Further, each material of the n-type semiconductor layer 400b and the p-type semiconductor layer 400d in this case is gallium nitride.

When the LED 400 is a blue LED, a material of the light emitting layer 400c includes, for example, indium, gallium, and nitrogen. The composition ratio of indium to gallium is typically indium: gallium=0.15: 0.85, but not limited to this. Further, each material of the n-type semiconductor layer 400b and the p-type semiconductor layer 400d in this case is gallium nitride.

The maximum emission wavelengths of the red, green, and blue LEDs are typically 645 nm, 530 nm, and 450 nm, respectively.

Even when the LED 400 is a red LED, a green LED, or a blue LED, aluminum can be used for the p-type electrode layer 400e and the n-type electrode layer 400f, but not limited to this.

The anode bump 400g and the cathode bump 400h are electrodes that are electrically connected to the electrode pad formed in the wiring forming layer 13. In addition, each of the anode bump 400g and the cathode bump 400h can adjust the height of the LED 400 (a distance from a surface of the electrode pad when the LED 400 is mounted to an upper surface of the LED 400). The anode bump 400g and the cathode bump 400h can be formed by plating, sputtering, vapor deposition, printing or the like. When the anode bump 400g and the cathode bump 400h are formed by plating, for example, gold can be used as a material of the anode bump 400g and the cathode bump 400h, but not limited to this.

For example, the LED 400 can be manufactured as follows. The n-type semiconductor layer 400b, the light emitting layer 400c, and the p-type semiconductor layer 400d are crystal-grown on the substrate 400a and etched so that a predetermined region is exposed. Then, the p-type electrode layer 400e and the n-type electrode layer 400f are formed. Finally, dicing is performed to separate the individual LEDs 400.

The LED 400 is not limited to the configuration shown in FIG. 4. For example, the LED 400 may be provided with the anode bump 400g and the cathode bump 400h on the p-type semiconductor layer 400d and the n-type semiconductor layer 400b respectively, without providing the p-type electrode layer 400e and the n-type electrode layer 400f.

Light emitted from the LED 400 can be emitted in a direction from the light emitting layer 400c to the substrate 400a. That is, the light emitted from the LED 400 is emitted through the substrate 400a. Further, the light emission of the LED 400 may be emitted in a direction from the light emitting layer 400c to the p-type semiconductor layer 400d and the n-type semiconductor layer 400b. Further, the light emitted from the LED 400 may be emitted from both directions. In this case, the display device 10 is a transparent display device capable of emitting light on both sides.

The size of the LED 400 mounted in the display device 10 is not particularly limited. For example, a mini LED or a micro LED can be used as the LED 400.

[5. Cross-sectional Structure of Display Device 10]

Figure 5:
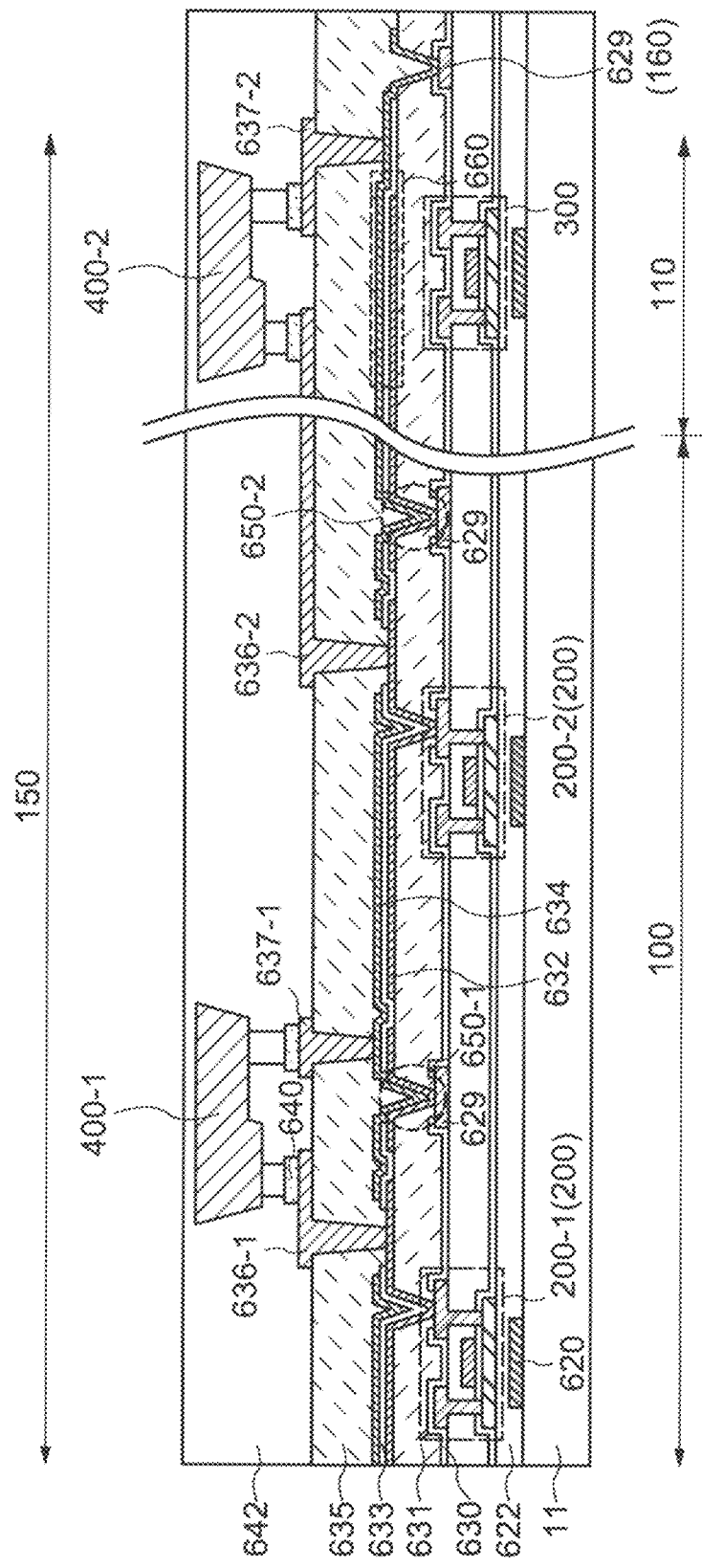
FIG. 5 is a schematic partial cross-sectional view of a display device according to an embodiment of the present invention.

The details of the cross-sectional structure of the display device 10 according to the embodiment of the present invention are described while referring to FIG. 5.

FIG. 5 is a schematic partial cross-sectional view of the display device 10 according to the embodiment of the present invention. Specifically, FIG. 5 is a partial cross-sectional view of the display device 10 along the line A-A' shown in FIG. 1D.

As shown in FIG. 5, the display device 10 includes the first pixel-circuit thin film transistor 200-1, the second pixel-circuit thin film transistor 200-2, the drive-circuit thin film transistor 300, the first LED400-1, and the second LED400-2. The first pixel-circuit thin film transistor 200-1 and the second pixel-circuit thin film transistor 200-2, and the drive-circuit thin film transistor 300 are provided over the substrate 11. Further, the first LED 400-1 and the second LED 400-2 are provided over the first pixel-circuit thin film transistor 200-1, the second pixel-circuit thin film transistor 200-2, and the drive-circuit thin film transistor 300. The first LED 400-1 is electrically connected to the first pixel-circuit thin film transistor 200-1, and the second LED 400-2 is electrically connected to the second pixel-circuit thin film transistor 200-2.

The substrate 11 can support each layer provided over the substrate 11. The substrate 11 may be a substrate capable of transmitting light emitted from the LED 400. For example, a rigid substrate having translucency such as a glass substrate, a quartz substrate, or a sapphire substrate can be used as the substrate 11. A rigid substrate having no translucency such as a silicon substrate can also be used as the substrate 11. Further, a flexible substrate having translucency such as a polyimide resin substrate, an acrylic resin substrate, a siloxane resin substrate, or a fluororesin substrate can be used as the substrate 11. Impurities may be introduced into the above resin substrate in order to improve heat resistance of the substrate 11. A substrate in which a silicon oxide film or a silicon nitride film is formed on the above-mentioned rigid substrate or flexible substrate can also be used as the substrate 11.

In the display device 10, a light-shielding layer 620 that overlaps the channel region may be provided below each of the pixel-circuit thin film transistor 200 and the drive-circuit thin film transistor 300. For example, the light-shielding layer 620 may be provided on the substrate 11, and the light-shielding layer 620 may be covered with the insulating layer 622. The light-shielding layer 620 can block light emitted from the LED 400 or external light, and can suppress photo-degradation of the pixel-circuit thin film transistor 200 and the drive-circuit thin film transistor 300.

The light-shielding layer 620 can reflect or absorb light emitted from the LED 400 or external light. For example, aluminum (Al), copper (Cu), titanium (Ti), molybdenum (Mo), tungsten (W), or an alloy or compound thereof can be used as a material of the light-shielding layer 620. Further, for example, a black resin (black matrix) can be used as the material of the light-shielding layer 620. Further, the light-shielding layer 620 may have a laminated structure as well as a single-layer structure. For example, the light-shielding layer 620 may have a laminated structure of a red color filter, a green color filter, and a blue color filter.

Hereinafter, a configuration of the wiring forming layer 13 provided between the thin film transistor forming layer 12 including the pixel-circuit thin film transistor 200 and the drive-circuit thin film transistor 300 and the LED mounting layer 14 in which the LED 400 is mounted is described.

In the wiring forming layer 13, a first conductive layer 629 is provided in the same layer as the source electrode layer 200e or the drain electrode layer 200f (see FIG. 3) of the pixel-circuit thin film transistor 200 (or using the same material as the source electrode layer 200e or the drain electrode layer 200f). The first conductive layer 629 may be a wiring layer corresponding to the low potential power supply wiring 241. The first conductive layer 629 provided adjacent to the drive circuit thin film transistor 300 may be a wiring layer corresponding to the common potential wiring 160. That is, the first conductive layer 629 corresponding to the common potential wiring 160 is provided so as to surround the display portion 150.

The first inorganic insulating layer 630 is provided on the first conductive layer 629, the source electrode layer 200e, and the drain electrode layer 200f. The first inorganic insulating layer 630 may be provided with an opening so that a part of the first conductive layer 629 or the source electrode layer 200e or the drain electrode layer 200f of the pixel-circuit thin film transistor 200 is exposed, if necessary.

The first planarization layer 631 is provided on the first inorganic insulating layer 630. The first planarization layer 631 may be provided with an opening so that a part of the first conductive layer 629 or the source electrode layer 200e or the drain electrode layer 200f of the pixel-circuit thin film transistor 200 is exposed, if necessary.

The second conductive layer 632 is provided on the first flattening layer 631. The second conductive layer 632 may be etched to form a plurality of separated regions. The second conductive layer 632 is electrically connected to the first conductive layer 629 or the source electrode layer 200e or the drain electrode layer 200f of the pixel-circuit thin film transistor 200 through the openings provided in each of the first inorganic insulating layer 630 and the first flattening layer 631. The second conductive layer 632 may be a wiring layer corresponding to the high potential power supply wiring 242.

The second inorganic insulating layer 633 is provided on the second conductive layer 632. The second inorganic insulating layer 633 may be provided with an opening so that a part of the first conductive layer 629 or the second conductive layer 632 is exposed, if necessary.

The third conductive layer 634 is provided on the second inorganic insulating layer 633. The third conductive layer 634 may be etched to form a plurality of separated regions. The third conductive layer 634 is electrically connected to the second conductive layer 632 via the opening provided in the second inorganic insulating layer 633. That is, a first cathode contact 650-1 and a second cathode contact 650-2 in which the first conductive layer 629, the second conductive layer 632, and the third conductive layer 634 are electrically connected are formed in the openings provided in the first flattening layer 631. Further, a cathode contact 651 in which the first conductive layer 629 provided adjacent to the drive-circuit thin film transistor 300 is electrically connected to the third conductive layer 634 without passing through the second conductive layer 632 is formed in another opening provided in the first flattening layer 631. The cathode contact 651 may have the same structure as the first cathode contact 650-1 and the second cathode contact 650-2.

The second flattening layer 635 is provided on the third conductive layer 634. The second flattening layer 635 may be provided with an opening so that a part of the second conductive layer 632 or the third conductive layer 634 is exposed, if necessary.

The first anode pad 636-1, the first cathode pad 637-1, the second anode pad 636-2, and the second cathode pad 637-2 are provided on the second flattening layer 635. Each of the first anode pad 636-1 and the second anode pad 636-2 is electrically connected to the second conductive layer 632 through the opening provided in the second flattening layer 635. On the other hand, each of the first cathode pad 637-1 and the second cathode pad 637-2 is electrically connected to the third conductive layer 634 via the opening provided in the second flattening layer 635. The second conductive layer 632, which is electrically connected to the first anode pad 636-1 and the second anode pad 636-2, is electrically connected to one of the source electrode layer 200e and the drain electrode layer 200f of the pixel-circuit thin film transistor 200. Since the other of the source electrode layer 200e and the drain electrode layer 200f of the pixel-circuit thin film film 200 is electrically connected to the wiring layer corresponding to the high potential power supply wiring 242 (not shown), a high potential is applied to the first anode pad 636-1 and the second anode pad 636-2. On the other hand, since the third conductive layer 634 electrically connected to the first cathode pad 637-1 and the second cathode pad 637-2 is a wiring layer corresponding to the low potential power supply wiring 241, a low potential is applied to the cathode pad 637-1 and the second cathode pad 637-2.

An inorganic insulating material can be used for each of the first inorganic insulating layer 630 and the second inorganic insulating layer 633. For example, silicon oxide ($SiO_x$), silicon nitride ($SiO_xN_y$), silicon nitride ($SiN_x$), silicon nitride ($SiN_xO_y$), aluminum oxide ($AlO_x$), aluminum nitride ($AlO_xN_y$), and oxidation oxide can be used. Aluminum ($AlN_xO_y$), aluminum nitride ($AlN_x$), or the like can be used as the inorganic insulating material. Further, each of the first inorganic insulating layer 630 and the second inorganic insulating layer 633 may be laminated with the above-mentioned inorganic insulating material. Here, $SiO_xN_y$ and $AlO_xN_y$ are silicon compounds and aluminum compounds containing nitrogen (N) in an amount smaller than oxygen (O). On the other hand, $SiN_xO_y$ and $AlN_xO_y$ are silicon compounds and aluminum compounds containing oxygen in an amount smaller than nitrogen.

A metal material can be used for each of the first conductive layer 629, the second conductive layer 632, and the third conductive layer 634. For example, copper (Cu), aluminum (Al), titanium (Ti), chromium (Cr), cobalt (Co), nickel (Ni), molybdenum (Mo), hafnium (Hf), and tantalum (Ta), tungsten (W), or bismus (Bi), or alloys or compounds thereof can be used as the metal material. Further, each of the first conductive layer 629, the second conductive layer 632, and the third conductive layer 634 may be laminated with the above-mentioned metal material. Further, a transparent conductive material such as indium tin oxide (ITO) or indium zinc oxide (IZO) can also be used for each of the first conductive layer 629, the second conductive layer 632, and the third conductive layer 634.

An organic insulating material can be used for each of the first flattening layer 631 and the second flattening layer 635. For example, a polyimide resin, an acrylic resin, an epoxy resin, a silicone resin, a fluororesin, a siloxane resin, or the like can be used as the organic insulating material. Further, each of the first flattening layer 631 and the second flattening layer 635 may be laminated with the above-mentioned organic insulating material, and may be laminated with the organic insulating material and the inorganic insulating material.

In the following, a configuration of the LED mounting layer 14 is described.

In the LED mounting layer 14, the first LED 400-1 is electrically connected to the first anode pad 636-1 and the first cathode pad 637-1 via a bonding layer 640. Further, the second LED 400-2 is electrically connected to the second anode pad 636-2 and the second cathode pad 637-2 via the bonding layer 640. The first LED 400-1 and the second LED 400-2 may be covered with a protective layer 642. The protective layer 642 may cover the upper surfaces of the first LED 400-1 and the second LED 400-2 respectively. Further, the protective layer 642 may cover a part of a side surface of each of the first LED 400-1 and the second LED 400-2 so as to expose an upper surface of each of the first LED 400-1 and the second LED 400-2.

In the present specification, when the first anode pad 636-1, the first cathode pad 637-1, the second anode pad 636-2, and the second cathode pad 637-2 are not particularly distinguished, each of the first anode pad 636-1, the first cathode pad 637-1, the second anode pad 636-2, and the second cathode pad 637-2 is described as an electrode pad.

For example, a metal material such as aluminum (Al), copper (Cu), titanium (Ti), molybdenum (Mo), or tungsten (W), or an alloy or compound thereof can be used as the material of the electrode pad. Further, for example, a transparent conductive material such as indium tin oxide (ITO) or indium zinc oxide (IZO) can be used as the material of the electrode pad.

The electrode pad may be a laminate of the above-mentioned metal material and transparent conductive material. When the electrode pad has a laminated structure, it is preferable that the transparent conductive material is laminated on the metal material. By covering a surface of the metal material with the transparent conductive material, the surface of the metal material can be protected.

For example, silver paste or solder can be used for the bonding layer 640. An anisotropic conductive film (ACF) can also be used as the bonding layer 640. Further, although the LED 400 shown in FIG. 5 is so-called flip-chip bonded on the electrode pad, the mounting of the LED 400 is not limited to this. The LED 400 may be mounted on the substrate 11 by wire bonding.

The first pixel-circuit thin film transistor 200-1 and the second pixel-circuit thin film transistor 200-2 are provided in the pixel circuit portion 100, and the drive-circuit thin film transistor 300 is provided in the drive circuit portion 110. On the other hand, the first LED 400-1 electrically connected to the first pixel-circuit thin film transistor 200-1 and the second LED 400-2 electrically connected to the second pixel-circuit thin film transistor 200-2 are provided in the pixel portion 150. That is, the display portion 150 overlaps not only the pixel circuit portion 100 but also the drive circuit portion 110. The second pixel-circuit thin film transistor 200-2 for controlling the second LED 400-2 provided so as to overlap with the drive circuit portion 110 is provided in the pixel circuit portion 100. Further, the second cathode contact 650-2 or the cathode contact 651 that is electrically connected to the second LED 400-2 is provided outside the drive circuit portion 110.

In the display device 10, since the second LED 400-2 is provided so as to overlap the drive circuit portion 110 in which the drive circuit is formed, the display portion 150 is not limited by the drive circuit portion 110. Therefore, the display device 10 is a display device having a narrow frame.

Figure 6:
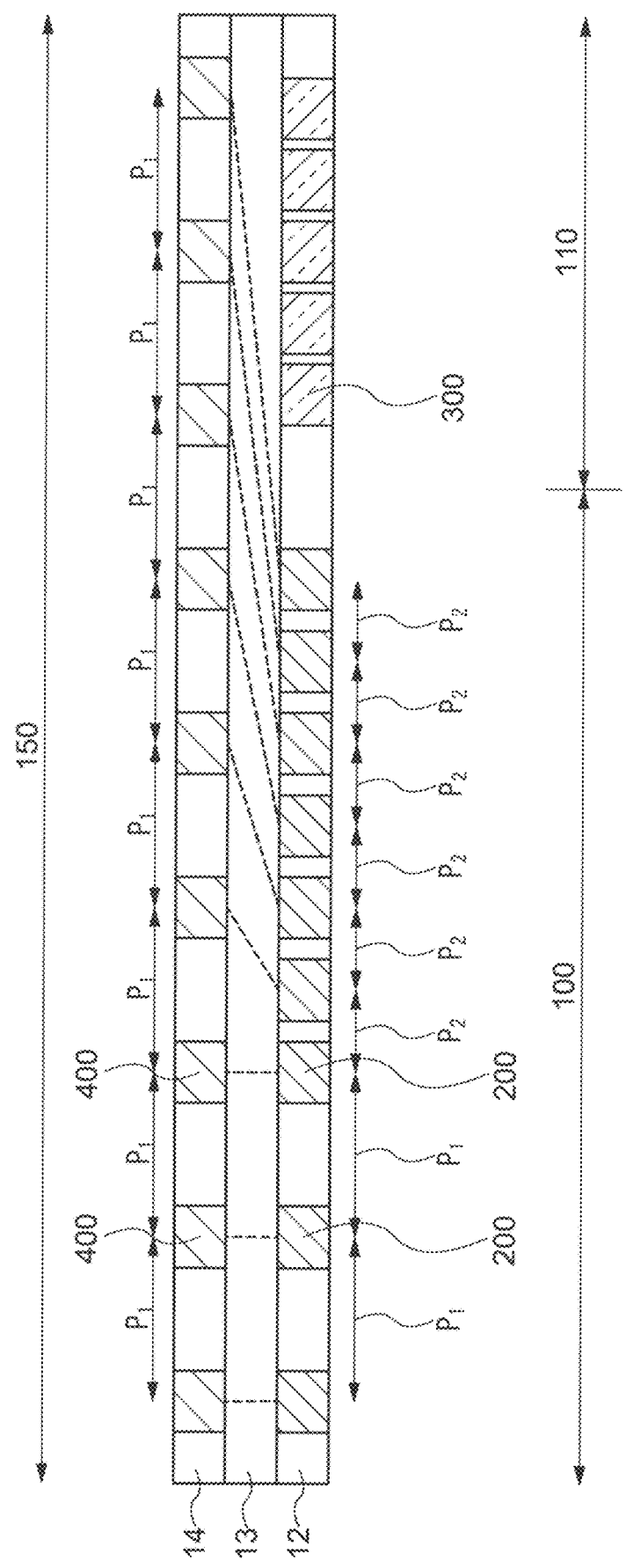
FIG. 6 is a schematic cross-sectional view of a display device according to an embodiment of the present invention.

Further, the details of the cross-sectional structure of the display device 10 according to the embodiment of the present invention are described while referring to FIG. 6.

FIG. 6 is a schematic cross-sectional view of the display device 10 according to the embodiment of the present invention. Specifically, FIG. 6 is a block diagram cross-sectionally showing the positional relationship between the thin film transistor forming layer 12, the wiring forming layer 13, and the LED mounting layer 14 of the display device 10. As shown in FIG. 6, the pixel-circuit thin film transistor 200 is provided in the pixel circuit portion 100 of the thin film transistor forming layer 12, and a drive-circuit thin film transistor 300 is provided in the drive circuit portion 110 of the thin film transistor forming layer 12. Further, the plurality of LEDs 400 are mounted in the display portion 150 of the LED mounting layer 14. Here, the plurality of LEDs 400 are arranged at a pitch $P_1$. Further, the dotted line in the wiring forming layer 13 represents an electrical connection, and the LED 400 is controlled by the pixel-circuit thin film transistor 200 connected by the dotted line.

The pixel-circuit thin film transistor 200 for controlling the LED 400 which is provided so as to overlap with the drive circuit portion 110 is provided in the pixel circuit portion 100. Therefore, in the pixel circuit portion 100, an integration density of the pixel-circuit thin film transistor 200 in the region near the drive circuit portion 110 is higher than an integration density of the pixel-circuit thin film transistor 200 in the region away from the drive circuit portion 110. For example, a pitch $P_2$ of the pixel-circuit thin film transistor 200 in the region near the drive circuit portion 110 is smaller than the pitch $P_1$ of the pixel-circuit thin film transistor 200 in the region away from the drive circuit portion 110.

The pitch of the pixel-circuit thin film transistor 200 is not limited to this. For example, the pitch of the pixel-circuit thin film transistor 200 can be increased as a distance from the drive circuit portion 110 increases.

Returning to FIG. 5, the display device 10 is described. In the display device 10, the third conductive layer 634 electrically connected to the common potential wiring 160 is provided in the region 660 between the drive circuit including the drive-circuit thin film transistor 300 and the second LED 400-2. Since a potential of the third conductive layer 634 in the region 660 is fixed to the potential of the common potential wiring 160, the third conductive layer 634 can function as a shielding layer that shields noise from the drive circuit. That is, in the display device 10, although the second LED 400-2 is provided so as to overlap the drive circuit, noise from the drive circuit is shielded by a third conductive layer 634 (shielding layer) provided between the drive circuit and the second LED 400-2. Therefore, even if the second LED 400-2 overlaps the drive circuit, the influence of noise from the drive circuit is reduced so that the operation of the second LED 400-2 is stable.

In the region 660, not only the third conductive layer 634 but also the second conductive layer 632 may be provided. The second conductive layer 632 in the region 660 is electrically connected to the third conductive layer 634 via the second cathode contact 650-2. Therefore, a potential of the second conductive layer 632 in the region 660 is fixed to the potential of the common potential wiring 160, and the second conductive layer 632 can also function as a shielding layer that shields noise from the drive circuit. In FIG. 5, although the second conductive layer 632 and the third conductive layer 634 in the region 660 are electrically connected via the second cathode contact 650-2, the second conductive layer 632 and the third conductive layer 634 may be electrically connected to each other on the first conductive layer 629 corresponding to the common potential wiring 160. In this case, it is not necessary to provide the second cathode contact 650-2.

As described above, in the display device 10 according to the present embodiment, since the drive circuit portion 110 in which the drive circuit is formed and the display portion 150 in which the second LED 400-2 is mounted are provided so as to overlap, the display portion 150 is not limited by the drive circuit portion 110. Therefore, the display device 10 is a display device having a narrow frame. Further, in the display device 10, since the third conductive layer 634 (shielding layer) to which a fixed potential is applied is provided between the drive circuit and the second LED 400-2, the noise from the drive circuit is shielded by the third conductive layer 634. Therefore, even if the second LED 400-2 is mounted so as to overlap the drive circuit portion 110, the influence of the noise from the drive circuit is reduced and the operation of the second LED 400-2 is stable.

<Modification 1>

Figure 7A:
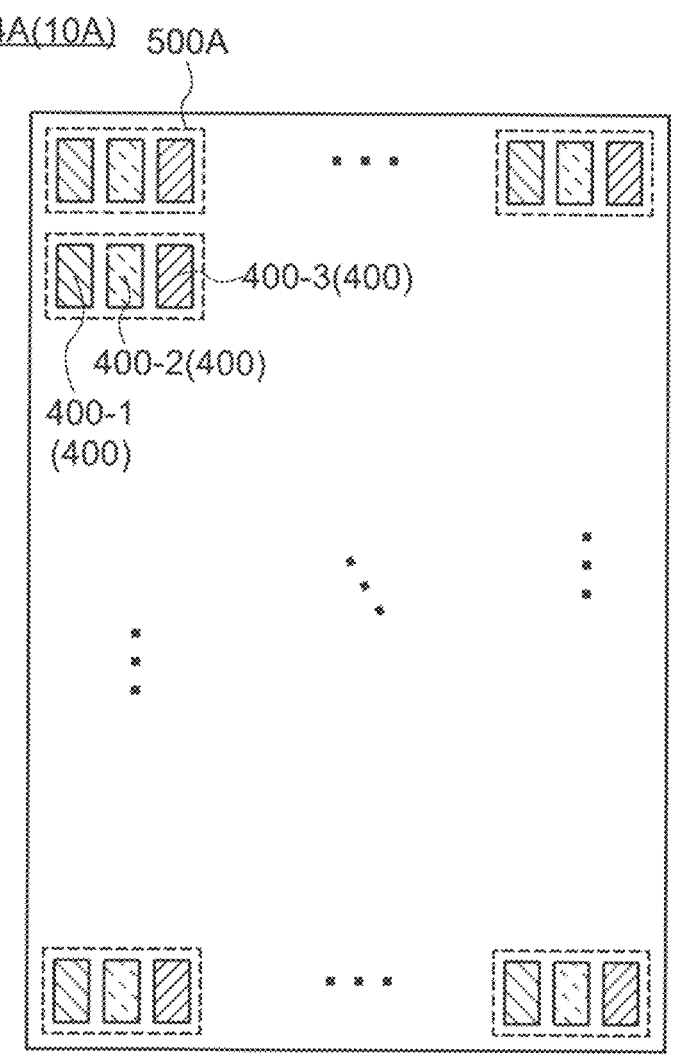
FIG. 7A is a schematic plan view of an LED mounting layer of a display device according to an embodiment of the present invention.
Figure 7B:
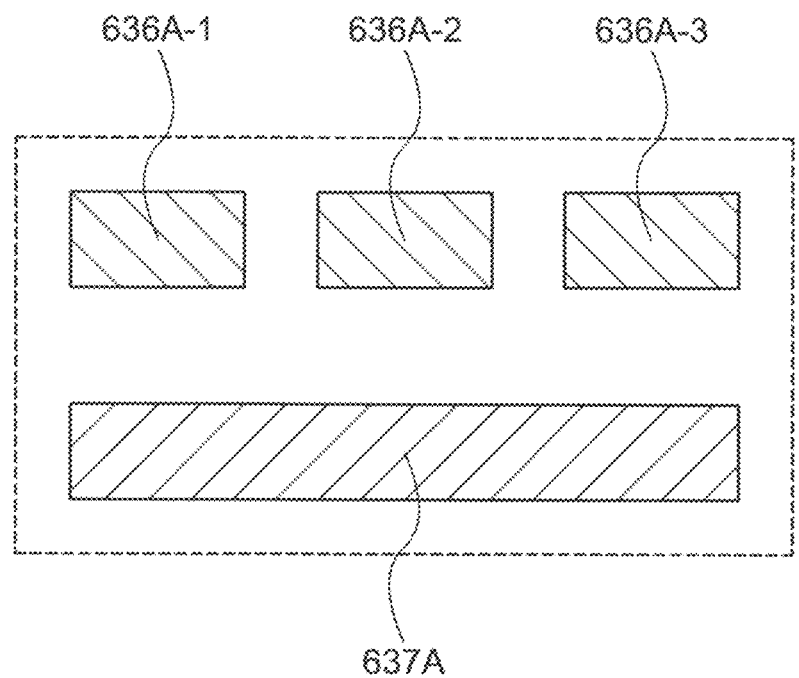
FIG. 7B is a schematic plan view showing an arrangement of electrode pads of pixels of a display device according to an embodiment of the present invention.

A display device 10A, which is a modification of the display device 10, is described while referring to FIGS. 7A and 7B. In the following description of a configuration of the display device 10A, the description of the same configuration as that of the display device 10 is omitted, and the configuration different from that of the display device 10 is mainly described.

FIG. 7A is a schematic plan view of the LED mounting layer 14A of the display device 10A according to the embodiment of the present invention. As shown in FIG. 7A, a first LED 400-1, a second LED 400-2, and a third LED 400-3 are mounted as a pixel 500A in the LED mounting layer 14A. Each of the first LED 400-1, the second LED 400-2, and the third LED 400-3 is arranged in the same direction. In other words, the first LED400-1, the second LED400-2, and the third LED400-3 are arranged in a stripe shape.

FIG. 7B is a schematic plan view showing an arrangement of electrode pads of the pixel 500A of the display device 10A according to the embodiment of the present invention. As shown in FIG. 7B, a first anode pad 636A-1 to which the first LED400-1 is connected, a second anode pad 636A-2 to which the second LED400-2 is connected, a third anode pad 636A-3 to which the third LED 400-3 is connected, and a common cathode pad 637A to which the first LED 400-1, the second LED 400-2, and the third LED 400-3 are connected are provided in the pixel 500A. That is, the common cathode pad 637A is provided not for each sub-pixel but for each pixel 500A.

In FIG. 7B, the first anode pad 636A-1, the second anode pad 636A-2, and the third anode pad 636A-3 are arranged in a straight line. However, the arrangement of the first anode pad 636A-1, the second anode pad 636A-2, and the third anode pad 636A-3 is not limited to this. For example, taking into consideration the sizes of the first LED 400-1, the second LED 400-2, and the third LED 400-3, and the first anode pad 636A-1, the second anode pad 636A-2, the third anode pad 636A-3 may be arranged so that a distance between each of the first anode pad 636A-1, the second anode pad 636A-2, and the third anode pad 636A-3 and the common cathode pad 637A is different.

As described above, in the display device 10A according to the present modification, the noise from the drive circuit is shielded by the shielding layer to which the fixed potential is applied, similar to the display device 10. Therefore, the operation of the LED 400 mounted so as to overlap the drive circuit is stable. Further, in the display device 10A, since the common cathode pad 637A is provided for each pixel 500A, the number of wirings or openings can be reduced, and the configuration of the wiring layer electrically connected to the common cathode pad 637A can be simplified.

<Modification 2>

Figure 8:
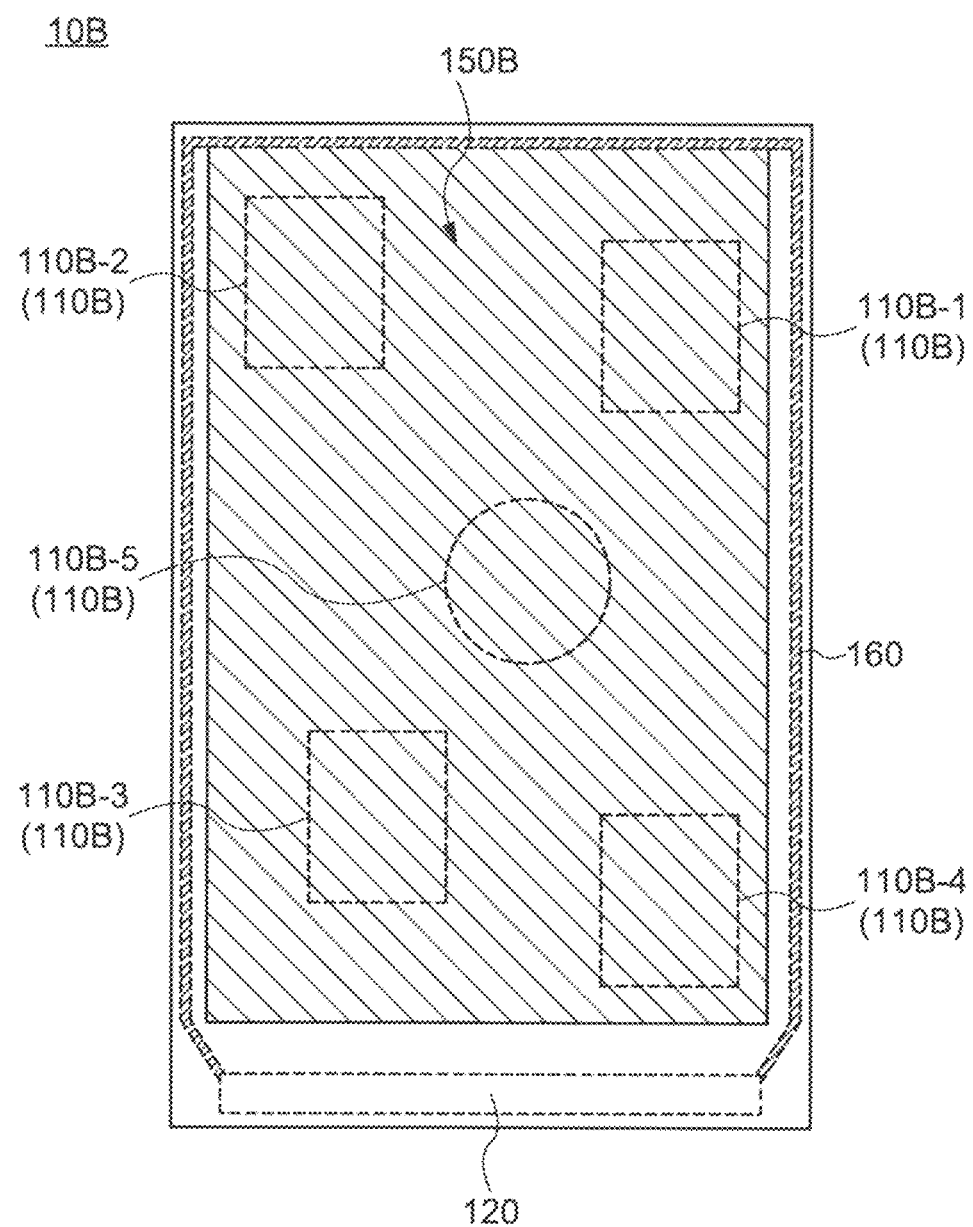
FIG. 8 is a schematic plan view of a display device according to an embodiment of the present invention.

A display device 10B, which is a modification of the display device 10, is described while referring to FIG. 8. In the following description of a configuration of the display device 10B, the description of the same configuration as that of the display device 10 is omitted, and the configuration different from that of the display device 10 is mainly described.

FIG. 8 is a schematic plan view of the display device 10B according to the embodiment of the present invention. Specifically, FIG. 8 is a diagram for explaining a positional relationship of configurations included in the thin film transistor forming layer 12, the wiring forming layer 13, and the LED mounting layer 14 in the plan view of the display device 10B. As shown in FIG. 8, the display device 10B includes a display portion 150B corresponding to the display surface. The display portion 150B overlaps a first drive circuit portion 110B-1, a second drive circuit portion 110B-2, a third drive circuit portion 110B-3, a fourth drive circuit portion 110B-4, and a fifth drive circuit portion 110B-5. Further, each of the first drive circuit portion 110B-1, the second drive circuit portion 110B-2, the third drive circuit portion 110B-3, the fourth drive circuit portion 110B-4, and the fifth drive circuit portion 110B-5 is surrounded by a pixel circuit portion. In the following, when the first drive circuit portion 110B-1, the second drive circuit portion 110B-2, the third drive circuit portion 110B-3, the fourth drive circuit portion 110B-4, and the fifth drive circuit portion 110B-5 are not particularly distinguished, each of the first drive circuit portion 110B-1, the second drive circuit portion 110B-2, the third drive circuit portion 110B-3, the fourth drive circuit portion 110B-4, and the fifth drive circuit portion 110B-5 is described as a drive circuit portion 110B.

In a plan view, a shape of the drive circuit portion 110B may be a substantially rectangular shape, a substantially circular shape, or a substantially elliptical shape. Further, areas of the plurality of drive circuit portions 110B may be the same or different. That is, in the display device 10B, the drive circuit portion 110B that overlaps the display portion 150B can be freely arranged. Even if the LED 400 of the display portion 150B is provided so as to overlap the drive circuit portion 110B, the LED 400 is hardly affected by the noise from the drive circuit because the shielding layer is provided between the drive circuit formed in the drive circuit portion 110B and the LED 400. Therefore, the operation of the LED 400 is stable As described above, in the display device 10B according to the present modification, the noise from the drive circuit is shielded by the shielding layer to which the fixed potential is applied, similar to the display device 10. Therefore, the operation of the LED 400 mounted so as to overlap the drive circuit is stable. Further, in the display device 10B, the area or arrangement of the drive circuit portion 110B can be determined in consideration of the specification of the product to which the display device 10B is applied without being limited to the display portion 150B.

Second Embodiment

Figure 9:
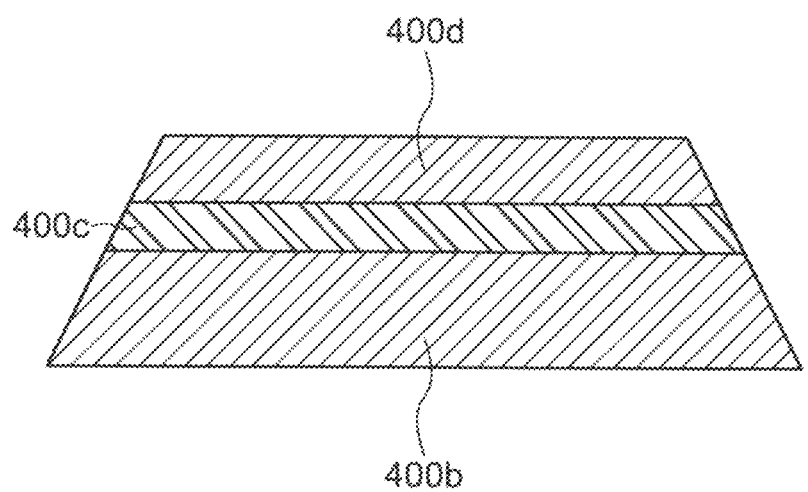
FIG. 9 is a schematic cross-sectional view of an LED mounted on an LED mounting layer of a display device according to an embodiment of the present invention.

A display device 20 according to an embodiment of the present invention is described while referring to FIGS. 9 and 10. The display device 20 includes an LED 400A having a so-called vertical LED structure (a vertical electrode structure).

[1. Configuration of LED 400A]

A configuration of the LED 400A mounted in the LED mounting layer 14 of the display device 20 according to the embodiment of the present invention is described while referring to FIG. 9.

FIG. 9 is a schematic cross-sectional view of the LED 400A mounted on the LED mounting layer 14 of the display device 20 according to the embodiment of the present invention. As shown in FIG. 9, the LED 400A includes an n-type semiconductor layer 400b, a light emitting layer 400c, and a p-type semiconductor layer 400d. Since each of the n-type semiconductor layer 400b, the light emitting layer 400c, and the p-type semiconductor layer 400d of the LED 400A is the same as that of the LED 400, the description thereof is omitted here. The n-type electrode layer 400f may be provided in contact with the n-type semiconductor layer 400b, or the p-type electrode layer 400e may be provided in contact with the p-type semiconductor layer 400d.

As described above, the vertical LED structure is an LED structure in which two semiconductor layers or two electrode layers are provided with a light emitting layer sandwiched therebetween.

The light emitted from the LED 400A can be emitted in any direction from the light emitting layer 400c to the n-type semiconductor layer 400b and from the light emitting layer 400c to the p-type semiconductor layer 400d.

[2. Cross-sectional Structure of Display Device 20]

The details of a cross-sectional structure of the display device 20 according to the embodiment of the present invention are described while referring to FIG. 10. In the following description of a configuration of the display device 20, the description of the same configuration as that of the display device 10 is omitted, and the configuration different from that of the display device 10 is mainly described.

FIG. 10 is a schematic partial cross-sectional view of the display device 20 according to the embodiment of the present invention. Specifically, FIG. 10 is a partial cross-sectional view of the display device 20 corresponding to the display device 10 along the line A-A' shown in FIG. 1D.

As shown in FIG. 10, the display device 20 includes the first pixel-circuit thin film transistor 200-1, the second pixel-circuit thin film transistor 200-2, the drive-circuit thin film transistor 300, a first LED400A-1, and a second LED400A-2. The first LED 400A-1 and the second LED 400A-2 are electrically connected to the first pixel-circuit thin film transistor 200-1 and the second pixel-circuit thin film transistor 200-2 respectively.

In the LED mounting layer 14, the first LED 400A-1 is electrically connected to the first cathode pad 637-1 via the bonding layer 640. Further, the second LED 400A-2 is electrically connected to the second cathode pad 637-2 via the bonding layer 640.

The protective layer 642 is provided so that at least a part of an upper surface of each of the first LED 400A-1 and the second LED 400A-2 is exposed. Further, openings in which a part of each of the first anode pad 636-1 and the second anode pad 636-2 is exposed may be provided in the protective layer 642.

A fourth conductive layer 644 is provided on the protective layer 642 corresponding to the pixel-circuit thin film transistor 200. That is, the fourth conductive layer 644 is provided on each of the pixel-circuit thin film transistors 200. In other words, the fourth conductive layer is provided over each of the LEDs 400A. The fourth conductive layer 644 is electrically connected to the first anode pad 636-1 via the opening provided in the protective layer 642, and is further electrically connected to the exposed upper surface of the LED 400A. The fourth conductive layer 644 electrically connected to the first pixel-circuit thin film transistor 200-1 and the fourth conductive layer 644 electrically connected to the second pixel-circuit thin film transistor 200-2 (ie, the two adjacent fourth conductive layers 644) are separated by a distance of about 4 to 8 pm. As shown in FIG. 10, in the display device 20, one fourth conductive layer 644 is formed in such a way that the area becomes larger. The size of the area of one fourth conductive layer 644 is reflected in the second capacitor 210-2 shown in FIG. 2. Therefore, by forming the large fourth conductive layer 644 that is electrically connected to the LED 400A, it is possible to suppress the variation in capacitance between the LEDs 400A.

The above-mentioned metal material or the above-mentioned transparent conductive material may be used for the fourth conductive layer 644. A metal material or a transparent conductive material for the fourth conductive layer 644 can be appropriately selected depending on the light emitting direction of the LED 400A. For example, if the light emitting direction of the LED 400A is the upper surface direction, it is preferable to use a transparent conductive material for the fourth conductive layer 644.

In the display device 20, since the second LED 400A-2 is provided so as to overlap with the drive circuit portion 110 in which the drive circuit is formed, the display portion 150 is not limited by the drive circuit portion 110. Therefore, the display device 20 is a display device having a narrow frame. Further, in the display device 20, the third conductive layer 634 electrically connected to the common potential wiring 160 is provided in the region 660 between the drive circuit including the drive-circuit thin film transistor 300 and the second LED 400A-2. Since the potential of the third conductive layer 634 in the region 660 is fixed to the potential of the common potential wiring 160, the third conductive layer 634 can function as the shielding layer that shields the noise from the drive circuit.

As described above, in the display device 20 according to the present embodiment, since the drive circuit portion 110 in which the drive circuit is formed and the display portion 150 in which the second LED 400A-2 is mounted are provided so as to overlap, the display portion 150 is not limited by the drive circuit portion 110. Therefore, the display device 20 is a display device having a narrow frame. Further, in the display device 20, since a third conductive layer 634 (shielding layer) to which a fixed potential is applied is provided between the drive circuit and the second LED 400A-2, the noise from the drive circuit is shielded by the third conductive layer 634. Therefore, even if the second LED 400A-2 is mounted so as to overlap the drive circuit portion 110, the influence of the noise from the drive circuit is reduced and the operation of the second LED 400A-2 is stable.

Third Embodiment

Figure 11:
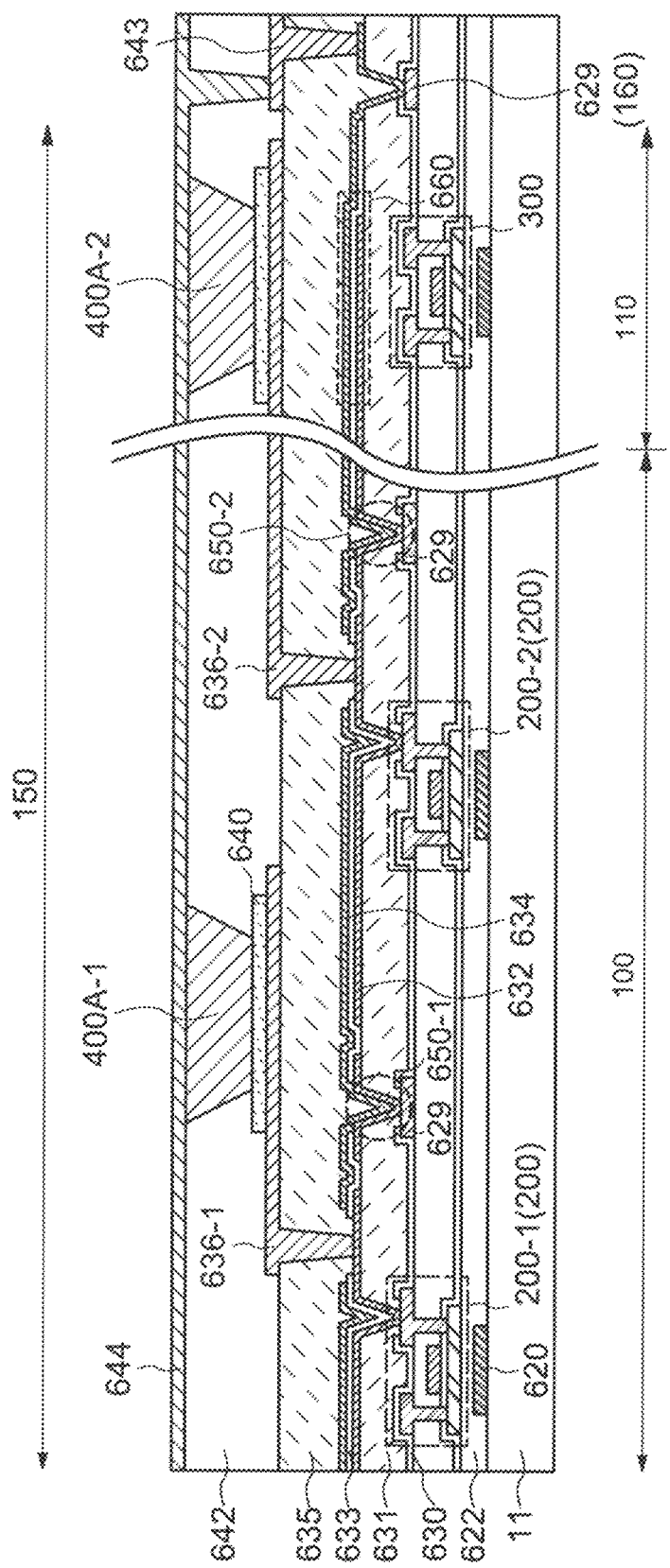
FIG. 11 is a schematic partial cross-sectional view of a display device according to an embodiment of the present invention.

A display device 30 according to an embodiment of the present invention is described while referring to FIG. 11. Although the display device 30 includes the LED 400A having a so-called vertical LED structure (a vertical electrode structure), polarities of the electrodes of the LED 400A of the display device 30 are opposite to those of the display device 20.

FIG. 11 is a schematic partial cross-sectional view of the display device 30 according to the embodiment of the present invention. Specifically, FIG. 11 is a partial cross-sectional view of the display device 30 corresponding to the display device 10 along the line A-A' shown in FIG. 1D.

As shown in FIG. 11, the display device 30 includes the first pixel-circuit thin film transistor 200-1, the second pixel-circuit thin film transistor 200-2, the drive-circuit thin film transistor 300, a first LED400A-1, and a second LED400A-2. The first LED 400A-1 and the second LED 400A-2 are electrically connected to the first pixel-circuit thin film transistor 200-1 and the second pixel-circuit thin film transistor 200-2 respectively.

In the wiring forming layer 13, openings in which a part of each of the second conductive layer 632 and the third conductive layer 634 is exposed may be provided in the second planarization layer 635. The first anode pad 636-1 and the second anode pad 636-2 are provided on the second flattening layer 635, and is electrically connected to the conductive layer 632 via the openings provided in the second flattening layer 635. Further, the common cathode pad 643 is provided on the second flattening layer 635 and is electrically connected to the third conductive layer 634 via the opening provided in the second flattening layer 635. The common cathode pad 643 is provided on the outside of the drive circuit portion 110 so as to be electrically connected to the third conductive layer 634 that is electrically connected to the common potential wiring 160.

In the LED mounting layer 14, the first LED 400A-1 is electrically connected to the first cathode pad 637-1 via the bonding layer 640. Further, the second LED 400A-2 is electrically connected to the second cathode pad 637-2 via the bonding layer 640.

The protective layer 642 is provided so that at least a part of an upper surface of each of the first LED 400A-1 and the second LED 400A-2 is exposed. Further, an opening in which a part of the common cathode pad 643 is exposed may be provided in the protective layer 642.

The fourth conductive layer 644 is provided on the protective layer 642. The fourth conductive layer 644 is electrically connected to the common cathode pad 643 via the opening provided in the protective layer 642. Further, the fourth conductive layer 644 is electrically connected to the exposed upper surface of the LED 400A.

In the display device 30, since the second LED 400A-2 is provided so as to overlap the drive circuit portion 110 in which the drive circuit is formed, the display portion 150 is not limited by the drive circuit portion 110. Therefore, the display device 20 is a display device having a narrow frame. Further, in the display device 20, the third conductive layer 634 electrically connected to the common potential wiring 160 is provided in the region 660 between the drive circuit including the drive-circuit thin film transistor 300 and the second LED 400A-2. Since the potential of the third conductive layer 634 in the region 660 is fixed to the potential of the common potential wiring 160, the third conductive layer 634 can function as the shielding layer that shields the noise from the drive circuit. That is, in the display device 30, although the second LED 400A-2 is provided so as to overlap the drive circuit, the noise from the drive circuit is reduced by the third conductive layer 634 (shielding layer) provided between the drive circuit and the second LED 400-2. Therefore, even if the second LED 400A-2 overlaps the drive circuit, the second LED 400-2 is hardly affected by the noise from the drive circuit. Therefore, the operation of the second LED 400A-2 is stable.

As described above, in the display device 30 according to the present embodiment, since the drive circuit portion 110 in which the drive circuit is formed and the display portion 150 in which the second LED 400A-2 is mounted are provided so as to overlap, the display portion 150 is not limited by the drive circuit portion 110. Therefore, the display device 30 is a display device having a narrow frame. Further, in the display device 30, since a third conductive layer 634 (shielding layer) to which a fixed potential is applied is provided between the drive circuit and the second LED 400A-2, the noise from the drive circuit is shielded by the third conductive layer 634. Therefore, even if the second LED 400A-2 is mounted so as to overlap the drive circuit portion 110, the influence of the noise from the drive circuit is reduced and the operation of the second LED 400A-2 is stable.

Fourth Embodiment

Figure 12:
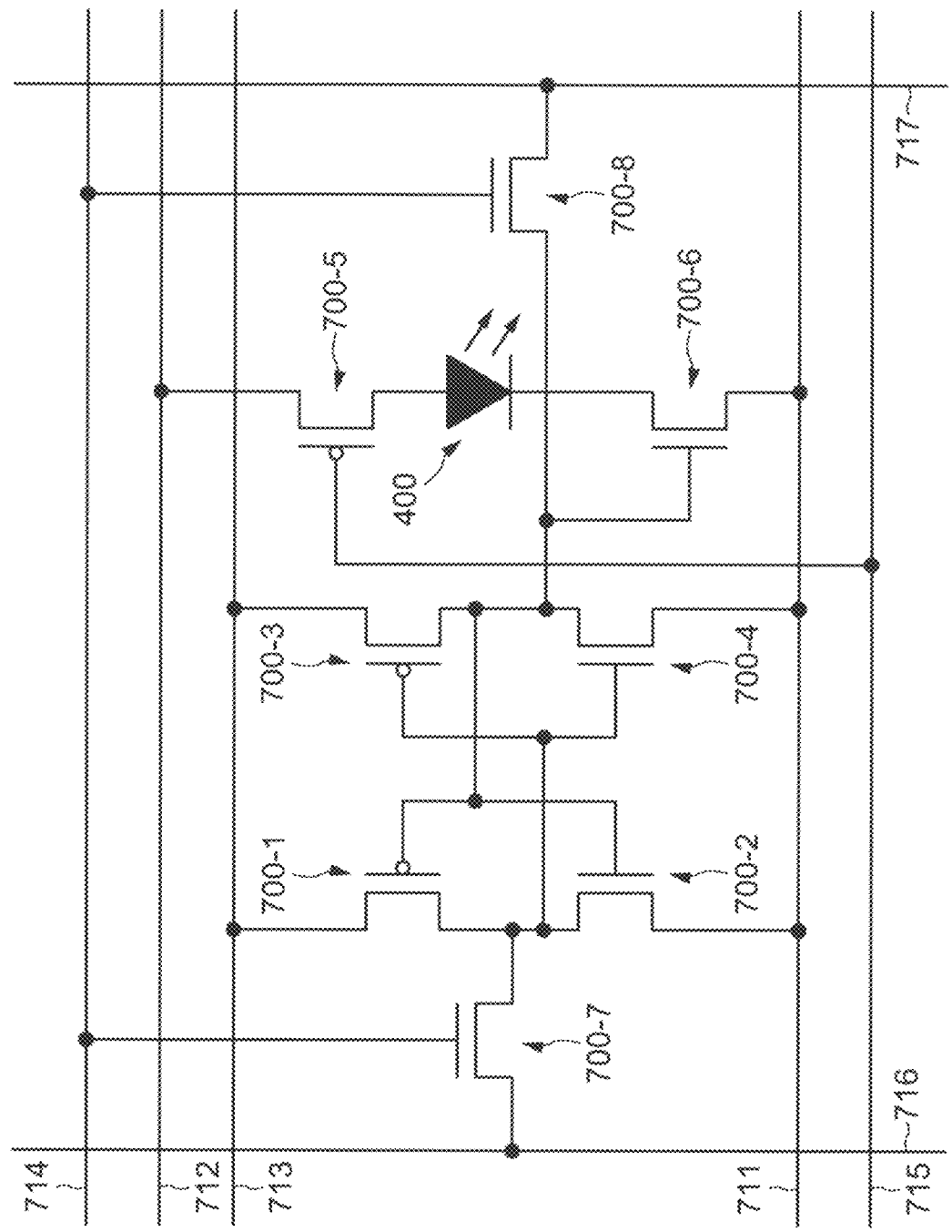
FIG. 12 is a circuit diagram showing a sub-pixel circuit of a sub-pixel of a display device according to an embodiment of the present invention.

A display device 40 according to an embodiment of the present invention is described while referring to FIG. 12. In the following description of a configuration of the display device 40, the description of the same configuration as that of the display device 10, the display device 20, or the display device 30 is omitted, and the configuration different from that of the display device 10, the display device 20, or the display device 30 is mainly described.

FIG. 12 is a circuit diagram showing a sub-pixel circuit of a sub-pixel of the display device 40 according to the embodiment of the present invention. As shown in FIG. 12, the sub-pixel circuit includes a first thin film transistor 700-1, a second thin film transistor 700-2, a third thin film transistor 700-3, a fourth thin film transistor 700-4, a fifth thin film transistor 700-5, a sixth thin film transistor 700-6, a seventh thin film transistor 700-7, an eighth thin film transistor 700-8, a low potential power supply wiring 711, a first high potential power supply wiring 712, a second high potential power supply wiring 713, a scanning wiring 714, an enable wiring 715, a data wiring 716, and an inverted data wiring 717.

A first inverter circuit is composed of the first thin film transistor 700-1 and the second thin film transistor 700-2. A second inverter circuit is composed of the third thin film transistor 700-3 and the fourth thin film transistor 700-4. A latch circuit is configured to electrically connect an output of the first inverter circuit and an input of the second inverter. Further, the low potential power supply wiring 711 and the second high potential power supply wiring 713 are connected to the latch circuit to supply power.

One of a source and a drain of the seventh thin film transistor 700-7 is electrically connected to an input of the latch circuit, and one of a source and a drain of the eighth thin film transistor 700-8 is electrically connected to an output of the latch circuit. Each gate of the seventh thin film transistor 700-7 and the eighth thin film transistor 700-8 is electrically connected to the scanning wiring 714. The other of the source and the drain of the seventh thin film transistor 700-7 is electrically connected to the data wiring 716. Further, the other of the source and the drain of the eighth thin film transistor 700-8 is electrically connected to the inverted data wiring 717.

An anode of the LED 400 is electrically connected to one of a source and a drain of the fifth thin film transistor 700-5. On the other hand, a cathode of the LED 400 is electrically connected to one of a source and a drain of the sixth thin film transistor 700-6. The other of the source and the drain of the fifth thin film transistor 700-5 is electrically connected to the first high potential power supply wiring 712. Further, the other of the source and the drain of the sixth thin film transistor 700-6 is electrically connected to the low potential power supply wiring 711. Further, a gate of the fifth thin film transistor 700-5 is electrically connected to the enable wiring 715, and a gate of the sixth thin film transistor 700-6 is electrically connected to the output of the latch circuit.

In the sub-pixel circuit of the display device 40, a potential of the data wiring 716 and a potential of the inverted data wiring 717 can be held in the latch circuit by controlling the seventh thin film transistor 700-7 and the eighth thin film transistor 700-8 with the scanning wiring 714. The output of the latch circuit is electrically connected to the gate of the sixth thin film 700-6. Therefore, when the fifth thin film transistor 700-5 is turned on by the enable signal from the enable wiring 715, a current corresponding to a potential of the gate of the sixth thin film transistor 700-6 is supplied to the LED 400 from the potential power supply wiring 712. An emission brightness of the LED 400 is determined by a value of the current supplied to the LED 400. That is, the sub-pixel circuit of the display device 40 includes a memory capable of holding the gradation data of the LED 400. In other words, the display device 40 is a memory-in-pixel drive type display device.

In the display device 40, the LED 400 may be mounted so as to overlap the latch circuit included in the sub-pixel circuit. In this case, the region 660 is provided between the latch circuit and the LED 400, and includes the shielding layer to which a fixed potential is applied. Therefore, even if the LED 400 overlaps the latch circuit, the noise from the latch circuit is shielded by the shielding layer.

As described above, in the display device 40 according to the present embodiment, the LED 400 can be provided so as to overlap the latch circuit included in the sub-pixel circuit. Therefore, the display device 40 is a display device having a narrow frame. Further, in the display device 40, since the shielding layer to which a fixed potential is applied is provided between the latch circuit and the LED 400, the noise from the latch circuit is shielded by the shielding layer. Therefore, even if the LED 400 is mounted so as to overlap the latch circuit, the influence of the noise from the latch circuit is reduced, so that the operation of the LED 400 is stable.

Each of the embodiments described above as an embodiment of the present invention can be appropriately combined and implemented as long as they do not contradict each other. Additions, deletion, or design changes of constituent elements, or additions, omissions, or changes to conditions of steps as appropriate based on a display device of the respective embodiments are also included within the scope of the present invention as long as the gist of the present invention is provided.

Other effects of the action which differ from those brought about by each of the above described embodiments, but which are apparent from the description herein or which can be readily predicted by those skilled in the art, are naturally understood to be brought about by the present invention.

What is claimed is:

1. A display device comprising:
    a display portion mounted with a first LED and a second LED;
    a pixel circuit portion provided with a first pixel-circuit thin film transistor electrically connected to the first LED and a second pixel-circuit thin film transistor electrically connected to the second LED, the pixel circuit portion being arranged in a central portion of a substrate;
    a drive circuit portion provided with a drive-circuit thin film transistor comprising a part of a scanning driving circuit, the drive circuit portion being arranged adjacent to the pixel circuit portion; and
    a shielding layer provided between the display portion and the drive circuit portion,
    wherein
    a fixed potential is applied to the shielding layer,
    the first LED overlaps the pixel circuit portion, and
    the second LED overlaps the drive circuit portion with the shielding layer therebetween.

2. The display device according to claim 1, wherein the drive circuit portion is surrounded by the pixel circuit portion.

3. The display device according to claim 1, wherein the fixed potential is a potential applied to a first electrode of the first LED and a second electrode of the second LED.

4. The display device according to claim 1, wherein the shielding layer is provided over a first flattening layer covering the drive-circuit thin film transistor.

5. The display device according to claim 4, wherein each of the first LED and the second LED is provided over a second flattening layer covering the shielding layer.

6. The display device according to claim 4, further comprising:
    a conductive layer and an inorganic insulating layer between the first flattening layer and the shielding layer,
    wherein the shielding layer overlaps the conductive layer with the inorganic insulating layer therebetween.

7. The display device according to claim 1, wherein each of the first LED and the second LED has a horizontal electrode structure.

8. The display device according to claim 1, wherein each of the first LED and the second LED has a vertical electrode structure.

* * * * *